US012813090B2

(12) United States Patent
Li et al.

(10) Patent No.: US 12,813,090 B2

(45) Date of Patent: Nov. 24, 2026

(54) DISPLAY PANEL AND METHOD OF MANUFACTURING THE SAME, AND DISPLAY APPARATUS

(71) Applicants: YUNNAN INVENSIGHT OPTOELECTRONICS TECHNOLOGY CO., LTD., Kunming (CN); BOE TECHNOLOGY GROUP CO., LTD., Beijing (CN)

(72) Inventors: Yunlong Li, Beijing (CN); Xiaochuan Chen, Beijing (CN); Pengcheng Lu, Beijing (CN); Kuanta Huang, Beijing (CN); Dacheng Zhang, Beijing (CN)

(73) Assignees: YUNNAN INVENSIGHT OPTOELECTRONICS TECHNOLOGY CO., LTD., Kunming (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 489 days.

(21) Appl. No.: 18/556,704

(22) PCT Filed: Mar. 17, 2022

(86) PCT No.: PCT/CN2022/081525

§ 371 (c)(1), (2) Date: Oct. 23, 2023

(87) PCT Pub. No.: WO2023/173375

PCT Pub. Date: Sep. 21, 2023

(65) Prior Publication Data

US 2024/0206242 A1 Jun. 20, 2024

(51) Int. Cl.

*H10K 59/122* (2023.01)
*H10K 59/12* (2023.01)

(Continued)

(52) U.S. Cl.

CPC ....... *H10K 59/122* (2023.02); *H10K 59/1201* (2023.02); *H10K 59/353* (2023.02);

(Continued)

(58) Field of Classification Search

CPC .................................................... H10K 59/122

(Continued)

(56) References Cited

U.S. PATENT DOCUMENTS

2019/0181205 A1* 6/2019 Kim .................... H10K 59/124
2020/0044177 A1* 2/2020 Kim .................... H10K 59/122

(Continued)

FOREIGN PATENT DOCUMENTS

CN 113921573 A 1/2022

*Primary Examiner* — Christopher M Raabe

(74) *Attorney, Agent, or Firm* — Dilworth & Barrese, LLP.; Michael J. Musella, Esq.

(57) ABSTRACT

A display panel, a method of manufacturing the same, and a display apparatus are provided. The light-emitting device includes a first electrode and a charge generation layer that are stacked; the pixel definition layer defines the opening regions that are in one-to-one correspondence with the sub-pixels and expose the first electrodes of the corresponding sub-pixels; the sub-pixels include a first sub-pixel and a second sub-pixel adjacent to each other; a space is between the first electrode of the first sub-pixel and the first electrode of the second sub-pixel, and the pixel definition layer includes a first recess in the space, the charge generation layer of the first sub-pixel and the charge generation layer of the second sub-pixel are spaced apart from each other by the first recess; depths of the first recesses of the pixel definition layer that are respectively in the spaces between different adjacent two sub-pixels are equal.

20 Claims, 14 Drawing Sheets

A-A'

(51) Int. Cl.

| | |
|---|---|
| ***H10K 59/35*** | (2023.01) |
| ***H10K 59/80*** | (2023.01) |
| ***H10K 71/20*** | (2023.01) |
| ***H10K 71/60*** | (2023.01) |
| *H10K 102/00* | (2023.01) |

(52) U.S. Cl.
CPC ..... *H10K 59/80524* (2023.02); *H10K 71/211* (2023.02); *H10K 71/60* (2023.02); *H10K 2102/351* (2023.02)

(58) Field of Classification Search
USPC .................................................. 313/498–512
See application file for complete search history.

(56) References Cited

U.S. PATENT DOCUMENTS

| | | | | |
|---|---|---|---|---|
| 2020/0152717 | A1 | 5/2020 | Hwang | |
| 2020/0185469 | A1* | 6/2020 | Kim | H10K 59/122 |
| 2021/0043705 | A1* | 2/2021 | Lim | H10K 59/122 |
| 2021/0202610 | A1* | 7/2021 | Ryu | H10K 59/122 |
| 2022/0158132 | A1* | 5/2022 | Kwak | H10K 59/123 |
| 2022/0352263 | A1* | 11/2022 | Lee | H10K 59/122 |
| 2022/0367581 | A1* | 11/2022 | Wang | H10K 59/80515 |
| 2026/0047316 | A1* | 2/2026 | You | B60K 35/22 |

* cited by examiner

DISPLAY PANEL AND METHOD OF MANUFACTURING THE SAME, AND DISPLAY APPARATUS

TECHNICAL FIELD

Embodiments of the present disclosure provide a display panel and a method of manufacturing the same, and a display apparatus.

BACKGROUND

Compared with traditional liquid crystal display (LCD) panels, organic light-emitting diode (OLED) display panels have the advantages of self-illumination, wide color gamut, high contrast, and thinness, making them widely used in the fields such as mobile phones and tablet computers. In addition, OLED display panels are also widely used in flexible and wearable fields such as smart watches. In a tandem OLED display panel, one sub-pixel usually includes multiple light-emitting devices connected in series.

SUMMARY

At least one embodiment of the present disclosure provides a display panel, and the display panel includes a substrate, a plurality of sub-pixels and a pixel definition layer. The substrate has a main surface; each sub-pixel of the plurality of sub-pixels includes a light-emitting device on the main surface, the light-emitting device includes a first electrode and a charge generation layer stacked in a direction perpendicular to the main surface, the charge generation layer is located on a side of the first electrode away from the substrate; the pixel definition layer is located on the main surface, and defines a plurality of opening regions, the plurality of opening regions are in one-to-one correspondence with the plurality of sub-pixels, and expose at least part of the first electrodes of the corresponding sub-pixels; the plurality of sub-pixels include a first sub-pixel and a second sub-pixel adjacent to each other, and a space is existed between the first electrode of the first sub-pixel and the first electrode of the second sub-pixel, the pixel definition layer includes a first recess located in the space and recessed toward the main surface, and the charge generation layer of the first sub-pixel and the charge generation layer of the second sub-pixel are spaced apart from each other by the first recess; the pixel definition layer includes a plurality of first recesses in spaces between different adjacent two sub-pixels among the plurality of sub-pixels, and the depths of the plurality of first recesses in a direction perpendicular to the main surface are equal.

For example, in the display panel provided by at least an embodiment of the present disclosure, the pixel definition layer comprises: a spacing part, a first stack part, and a second stack part. The spacing part is in the space between the first electrode of the first sub-pixel and the first electrode of the second sub-pixel; the first stack part is stacked on a side of the first electrode of the first sub-pixel away from the substrate in the direction perpendicular to the main surface; and the second stack part is stacked on a side of the first electrode of the second sub-pixel away from the substrate in the direction perpendicular to the main surface, and the spacing part comprises the first recess.

For example, in the display panel provided by at least an embodiment of the present disclosure, the main surface has a middle portion located at the space, the middle portion of the main surface is flat, and the spacing part is on the middle portion of the main surface; the first recess has a first bottom surface substantially parallel to the main surface; the display panel further comprises a floating charge generation layer, and the floating charge generation layer is in the first recess and on the first bottom surface; a material of the floating charge generation layer is same as materials of the charge generation layer of the first sub-pixel and the charge generation layer of the second sub-pixel; the charge generation layer of the first sub-pixel is on a side of the first stack part away from the main surface, and the charge generation layer of the second sub-pixel is on a side of the second stack part away from the main surface; the charge generation layer of the first sub-pixel is disconnected from the floating charge generation layer, and the charge generation layer of the second sub-pixel is disconnected from the floating charge generation layer.

For example, in the display panel provided by at least an embodiment of the present disclosure, the first stack part, the spacing part and the second stack part constitute a continuous integrated structure; the spacing part of the pixel definition layer covers and directly contacts a side surface of the first electrode of the first sub-pixel close to the first electrode of the second sub-pixel, the flat middle portion of the main surface, and a side surface of the first electrode of the second sub-pixel close to the first electrode of the first sub-pixel; the first stack part covers and directly contacts a portion of an upper surface of the first electrode of the first sub-pixel away from the substrate, and the second stack part covers and directly contacts a portion of an upper surface of the first electrode of the second sub-pixel away from the substrate.

For example, in the display panel provided by at least an embodiment of the present disclosure, an edge close to the second sub-pixel of an orthographic projection of the charge generation layer of the first sub-pixel on the main surface and an edge close to the first sub-pixel of an orthographic projection of the floating charge generation layer on the main surface are connected to each other, and an edge close to the first sub-pixel of an orthographic projection of the charge generation layer of the second sub-pixel on the main surface and an edge close to the second sub-pixel of an orthographic projection of the floating charge generation layer on the main surface are connected to each other.

For example, in the display panel provided by at least an embodiment of the present disclosure, thicknesses of the first electrodes of the plurality of sub-pixels in the direction perpendicular to the main surface are equal, and a thickness of the first electrode of each of the plurality of sub-pixels is not less than 450 μm, a depth of the first recess in a direction perpendicular to the main surface is not less than 900 μm.

For example, in the display panel provided by at least an embodiment of the present disclosure, both a ratio of a thickness of the first electrode of the first sub-pixel in the direction perpendicular to the main surface to a thickness of the pixel definition layer in the direction perpendicular to the main surface, and a ratio of a thickness of the first electrode of the second sub-pixel in the direction perpendicular to the main surface to the thickness of the pixel definition layer in the direction perpendicular to the main surface are not less than 2.

For example, in the display panel provided by at least an embodiment of the present disclosure, the main surface has a middle portion located at the space, the middle portion of the main surface has a second recess, and the spacing part of the pixel definition layer has a fracture which is at the second recess and penetrates through the spacing part, the second recess is in communication with the first recess through the fracture; the second recess has a second bottom surface substantially parallel to the main surface, and the display panel further comprises a first etching stop layer, the first etching stop layer is in the second recess and on the second bottom surface, and a material of the first etching stop layer is different from a material of the substrate and different from a material of the pixel definition layer; the display panel further comprises a floating charge generation layer, and the floating charge generation layer is in the second recess and on a side of the first etching stop layer away from the second bottom surface; a material of the floating charge generation layer is same as both a material of the charge generation layer of the first sub-pixel and a material of the charge generation layer of the second sub-pixel; the charge generation layer of the first sub-pixel is located on a side of the first stack part away from the main surface, and the charge generation layer of the second sub-pixel is located on a side of the second stack part away from the main surface; the charge generation layer of the first sub-pixel is disconnected from the floating charge generation layer, and the charge generation layer of the second sub-pixel is disconnected from the floating charge generation layer.

For example, in the display panel provided by at least an embodiment of the present disclosure, the first electrode of each of the plurality of sub-pixels comprises a metal electrode layer and a transparent electrode layer that are stacked in the direction perpendicular to the main surface, the transparent electrode layer covers the metal electrode layer, and the first etching stop layer and the transparent electrode layer are made of a same material and are at a same layer.

For example, in the display panel provided by at least an embodiment of the present disclosure, along a direction from the main surface to a bottom surface of the second recess, a size of the second recess in a direction parallel to the main surface gradually increases, or first gradually increases and then gradually decreases.

For example, in the display panel provided by at least an embodiment of the present disclosure, a shape of a cross-section of the second recess along the direction perpendicular to the main surface is a trapezoid or an irregular shape, and the irregular shape comprises a bottom edge substantially parallel to the main surface, a first side edge and a second side edge that face each other and both intersect the bottom edge, the first side edge is recessed toward a direction away from the second side edge, and the second side edge is recessed toward a direction away from the first side edge.

For example, in the display panel provided by at least an embodiment of the present disclosure, the display panel further comprises: a second etching stop layer, on the main surface and in the space; the second etching stop layer, the first electrode of the first sub-pixel, and the first electrode of the second sub-pixel are made of a same material, at a same layer and spaced apart from each other; the first recess is on a side of the second etching stop layer away from the substrate, and exposes at least a portion of an upper surface of the second etching stop layer that is away from the substrate.

For example, in the display panel provided by at least an embodiment of the present disclosure, along a direction from a location away from the main surface to a location close to the main surface, a size of the first recess in a direction parallel to the main surface gradually increases, or, first gradually increases and then gradually decreases.

For example, in the display panel provided by at least an embodiment of the present disclosure, the light-emitting device comprises a first light-emitting element emitting light of a first color and a second light-emitting element emitting light of a second color, the first color is different from the second color, and the charge generation layer is between the first light-emitting element and the second light-emitting element and is connected to the first light-emitting element and the second light-emitting element.

At least one embodiment of the present disclosure further provides a display apparatus, the display apparatus comprises the display panel according to any one of the embodiments of the present disclosure.

At least one embodiment of the present disclosure further provides a method of manufacturing a display panel, the method comprises: providing a substrate, in which the substrate has a main surface; forming a plurality of sub-pixels on the substrate, in which each sub-pixel of the plurality of sub-pixels comprises a light-emitting device on the main surface, and the light-emitting device comprises a first electrode and a charge generation layer that are stacked in a direction perpendicular to the main surface, the charge generation layer is on a side of the first electrode away from the substrate; and forming a pixel definition layer, in which the pixel definition layer is on the main surface and defines a plurality of opening regions, the plurality of opening regions are in one-to-one correspondence with the plurality of sub-pixels, and expose at least part of first electrodes of corresponding sub-pixels of the plurality of sub-pixels; the plurality of sub-pixels comprises a first sub-pixel and a second sub-pixel adjacent to each other, and a space is between the first electrode of the first sub-pixel and the first electrode of the second sub-pixel, the pixel definition layer comprises a first recess which is in the space and recessed toward the main surface, the charge generation layer of the first sub-pixel is spaced apart from the charge generation layer of the second sub-pixel by the first recess; the pixel definition layer comprises a plurality of first recesses located in spaces between different adjacent two sub-pixels among the plurality of sub-pixels, and depths of the plurality of first recesses in the direction perpendicular to the main surface are equal.

For example, in the method of manufacturing the display panel provided by at least an embodiment of the present disclosure, the main surface has a middle portion located at the space, the middle portion of the main surface is flat; forming the first recess comprises: forming the first electrode of the first sub-pixel and the first electrode of the second sub-pixel on the main surface, in which the first electrode of the first sub-pixel and the first electrode of the second sub-pixel expose a portion of the main surface in the space; and forming a pixel-defining material layer on a side of the first electrode of the first sub-pixel and the first electrode of the second sub-pixel away from the substrate, so as to simultaneously form the first recess and the pixel definition layer by utilizing a thickness of the first electrode of the first sub-pixel in the direction perpendicular to the main surface and a thickness of the first electrode of the second sub-pixel in the direction perpendicular to the main surface, in which the first recess is formed without performing a patterning process on the pixel definition layer.

For example, the method of manufacturing the display panel provided by at least an embodiment of the present disclosure comprises: performing a patterning process on the pixel definition material layer to form the plurality of opening regions, thereby forming the pixel definition layer; and forming the charged generated layer of the first sub-pixel, the charge generation layer of the second sub-pixel, and a floating charge generation layer on a side of the pixel definition layer away from the substrate by using a same one material and a same one layer forming process, the first recess has a first bottom surface substantially parallel to the main surface, the floating charge generation layer is located in the first recess and on the first bottom surface, the charge generation layer of the first sub-pixel is located on a side of the first stack part away from the main surface, and the charge generation layer of the second sub-pixel is located on a side of the second stack part away from the main surface; and, the charge generation layer of the first sub-pixel is disconnected from the floating charge generation layer, and the charge generation layer of the second sub-pixel is disconnected from the floating charge generation layer by utilizing a depth of the first recess in the direction perpendicular to the substrate.

For example, in the method of manufacturing the display panel provided by at least an embodiment of the present disclosure, the pixel definition layer comprises: a spacing part, a first stack part, and a second stack part. The spacing part is in the space between the first electrode of the first sub-pixel and the first electrode of the second sub-pixel; the first stack part is stacked on a side of the first electrode of the first sub-pixel away from the substrate in the direction perpendicular to the main surface; and the second stack part is stacked on a side of the first electrode of the second sub-pixel away from the substrate in the direction perpendicular to the main surface; the spacing part comprises the first recess; the spacing part of the pixel definition layer covers and directly contacts a side surface of the first electrode of the first sub-pixel close to the first electrode of the second sub-pixel, a portion of the main surface located at the space, and a side surface of the first electrode of the second sub-pixel close to the first electrode of the first sub-pixel; the first stack part covers and directly contacts a portion of an upper surface of the first electrode of the first sub-pixel away from the substrate, and the second stack part covers and directly contacts a portion of an upper surface of the first electrode of the second sub-pixel away from the substrate.

For example, in the method of manufacturing the display panel provided by at least an embodiment of the present disclosure, the main surface has a middle portion located at the space, and the method comprises: forming a second recess on the middle portion of the main surface; forming a first etching stop layer, in which the second recess has a second bottom surface substantially parallel to the main surface, and the first etching stop layer is located in the second recess and on the second bottom surface; and forming a pixel definition material layer covering the first electrode of the first sub-pixel, the first electrode of the second sub-pixel, and the second recess; performing a patterning process on the pixel definition material layer to form a fracture and the opening regions to form the pixel definition layer, in which the pixel definition layer comprises: a spacing part, a first stack part, and a second stack part. The spacing part is located in the space between the first electrode of the first sub-pixel and the first electrode of the second sub-pixel; the first stack part is stacked on a side of the first electrode of the first sub-pixel away from the substrate in the direction perpendicular to the main surface; and a second stack part, stacked on a side of the first electrode of the second sub-pixel away from the substrate in a direction perpendicular to the main surface; the spacing part comprises the first recess; the fracture is located at the spacing part of the pixel definition layer at the second recess, and penetrates through the spacing part, and the second recess is in communication with the first recess through the fracture.

For example, the method of manufacturing the display panel provided by at least an embodiment of the present disclosure comprises: forming a metal electrode material layer on the main surface, and performing a patterning process on the metal electrode material layer to form a metal electrode layer of the first electrode of the first sub-pixel and a metal electrode layer of the first electrode of the second sub-pixel; and forming a transparent electrode material layer covering the metal electrode layer of the first electrode of the first sub-pixel, the metal electrode layer of the first electrode of the second sub-pixel, and the second bottom surface, and performing a patterning process on the transparent electrode material layer to form a transparent electrode layer of the first electrode of the first sub-pixel that covers the metal electrode layer of the first electrode of the first sub-pixel, a transparent electrode layer of the first electrode of the second sub-pixel that covers the metal electrode layer of the first electrode of the second sub-pixel, and the first etching stop layer.

For example, the method of manufacturing the display panel provided by at least an embodiment of the present disclosure further comprises: forming a charge generation layer of the first sub-pixel, a charge generation layer of the second sub-pixel, and a floating charge generation layer on a side of the pixel definition layer away from the substrate using a same one material and a same one layer forming process, in which the second recess has a second bottom surface substantially parallel to the main surface, the floating charge generation layer is located in the second recess and located on a side of the first etching stop layer away from the second bottom surface, the charge generation layer of the first sub-pixel is located on a side of the first stack part away from the main surface, and the charge generation layer of the second sub-pixel is located on a side of the second stack part away from the main surface, the charge generation layer of the first sub-pixel is disconnected from the floating charge generation layer, and the charge generation layer of the second sub-pixel is disconnected from the floating charge generation layer.

For example, the method of manufacturing the display panel provided by at least an embodiment of the present disclosure further comprises: etching the second recess after forming the second etching stop layer, such that along a direction from the main surface to a bottom surface of the second recess, a size of the second recess in a direction parallel to the main surface gradually increases, or first gradually increases and then gradually decreases.

For example, the method of manufacturing the display panel provided by at least an embodiment of the present disclosure comprises: forming a second etching stop layer on the main surface, in which the second etching stop layer is located in the space between the first electrode of the first sub-pixel and the first electrode of the second sub-pixel; forming a pixel definition material layer covering the first electrode of the first sub-pixel, the first electrode of the second sub-pixel, and the second etching stop layer; and performing a patterning process on the pixel definition material layer to form the first recess and the plurality of opening regions, in which the first recess is located on a side of the second etching stop layer away from the substrate, and exposes at least a portion of an upper surface of the second etching stop layer away from the substrate.

For example, the method of manufacturing the display panel provided by at least an embodiment of the present disclosure comprises: forming a metal electrode material layer on the main surface, performing one patterning process on the metal electrode material layer to form a metal electrode layer of the first electrode of the first sub-pixel, a metal electrode layer of the first electrode of the second sub-pixel, and a metal electrode layer of the second etching stop layer, in which the metal electrode layer of the second etching stop layer is located between the metal electrode layer of the first electrode of the first sub-pixel and the metal electrode layer of the first electrode of the second sub-pixel; and forming a transparent electrode material layer covering the metal electrode layer of the first electrode of the first sub-pixel, the first electrode of the second sub-pixel, and the metal electrode layer of the second etching stop layer, and performing one patterning process on the transparent electrode material layer to form a transparent electrode layer of the first electrode of the first sub-pixel that covers the metal electrode layer of the first electrode of the first sub-pixel, a transparent electrode layer of the first electrode of the second sub-pixel that covers the metal electrode layer of the first electrode of the second sub-pixel, and a transparent electrode layer of the second etching stop layer that covers the metal electrode layer of the second etching stop layer.

BRIEF DESCRIPTION OF DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

Figure 1:
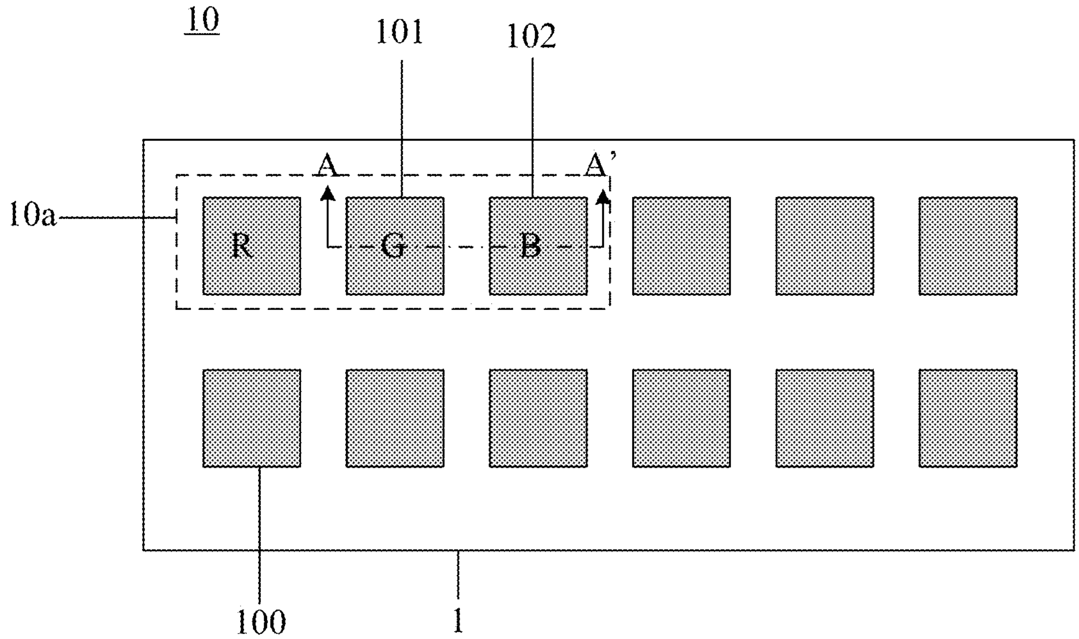
FIG. 1 is a schematic planar view of a display panel provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms “first,” “second,” etc., which are used in the description and the claims of the present application for disclosure, are not intended to indicate any sequence, amount or importance, but distinguish various components. Also, the terms “comprise,” “comprising,” “include,” “including,” etc., are intended to specify that the elements or the objects stated before these terms encompass the elements or the objects and equivalents thereof listed after these terms, but do not preclude the other elements or objects. The phrases “connect”, “connected”, etc., are not intended to define a physical connection or mechanical connection, but may include an electrical connection, directly or indirectly. “On,” “under,” “left,” “right” and the like are only used to indicate relative position relationship, and when the position of the object which is described is changed, the relative position relationship may be changed accordingly.

A tandem organic light-emitting diode (Tandem OLED) device is prone to has an issue of crosstalk between adjacent sub-pixels that is caused due to low resistivities of the hole injection layer (HIL) and the charge generation layer (CGL), which may result in reduction of the color gamut of the OLED device, and the display effect of the OLED display panel using the OLED device will thus be reduced. Therefore, preventing crosstalk between adjacent sub-pixels is very important for improving the display effect of the OLED display panel. Moreover, it is very important to achieve display uniformity across the entire display panel while preventing crosstalk between adjacent sub-pixels.

At least one embodiment of the present disclosure provides a display panel, and the display panel includes a substrate, a plurality of sub-pixels and a pixel definition layer. The substrate has a main surface; each sub-pixel of the plurality of sub-pixels includes a light-emitting device on the main surface, the light-emitting device includes a first electrode and a charge generation layer stacked in a direction perpendicular to the main surface, the charge generation layer is located on a side of the first electrode away from the substrate; the pixel definition layer is located on the main surface, and defines a plurality of opening regions, the plurality of opening regions are in one-to-one correspondence with the plurality of sub-pixels, and expose at least part of the first electrodes of the corresponding sub-pixels; the plurality of sub-pixels include a first sub-pixel and a second sub-pixel adjacent to each other, and a space is existed between the first electrode of the first sub-pixel and the first electrode of the second sub-pixel, the pixel definition layer includes a first recess located in the space and recessed toward the main surface, and the charge generation layer of the first sub-pixel and the charge generation layer of the second sub-pixel are spaced apart from each other by the first recess; the pixel definition layer includes a plurality of first recesses in spaces between different adjacent two sub-pixels among the plurality of sub-pixels, and the depths of the plurality of first recesses in a direction perpendicular to the main surface are equal.

Figure 2:
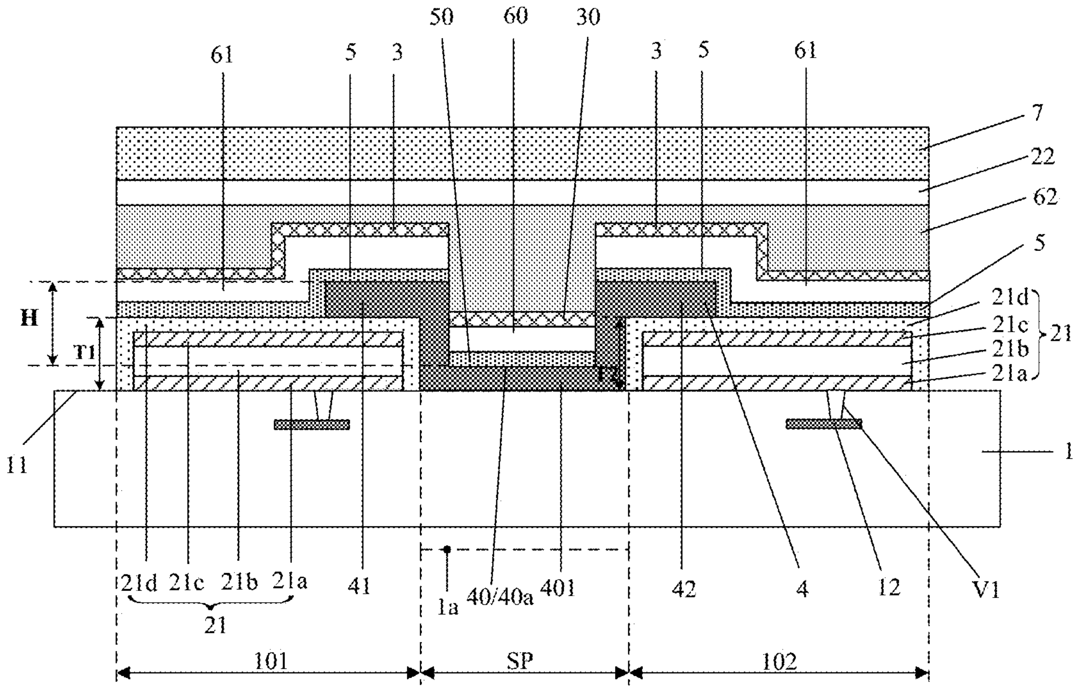
FIG. 2 is a schematic cross-sectional view taken along a line A-A' in FIG. 1.

Illustratively, FIG. 1 is a schematic planar view of a display panel provided by an embodiment of the present disclosure, and FIG. 2 is a schematic cross-sectional view along a line A-A' in FIG. 1. Referring to FIG. 1 and FIG. 2, a display panel 10 provided by at least one embodiment of the present disclosure includes: a substrate 1, a plurality of sub-pixels 100 and a pixel definition layer 4. The substrate 1 has a main surface 11; each sub-pixel of the plurality of sub-pixels 100 includes a light-emitting device located on the main surface 11, for example, the light-emitting device is a tandem organic light-emitting diode (Tandem OLED) device; the light-emitting device includes a first electrode 21 and a charge generation layer (CGL) 3 stacked in a direction perpendicular to the main surface 11, the charge generation layer 3 is located on a side of the first electrode 21 away from the substrate 1; the pixel definition layer 4 is located on the main surface 11, and defines a plurality of opening regions, the plurality of opening regions are in one-to-one correspondence with the plurality of sub-pixels 100, and respectively expose at least part of the first electrodes 21 of the corresponding sub-pixels 100; the plurality of sub-pixels 100 include a first sub-pixel 101 and a second sub-pixel 102 adjacent to each other, and a space SP is existed between the first electrode 21 of the first sub-pixel 101 and the first electrode 21 of the second sub-pixel 102, the pixel definition layer 4 includes a first recess 40 located in the space SP and recessed toward the main surface 11, and the charge generation layer 3 of the first sub-pixel 101 and the charge generation layer 3 of the second sub-pixel 102 are spaced apart from each other by the first recess 40; the pixel definition layer 4 includes a plurality of first recesses 40 in spaces between different adjacent two sub-pixels 100 among the plurality of sub-pixels 100, and the depths H of the plurality of first recesses 40 in a direction perpendicular to the main surface 11 are equal.

For example, generally, recesses are formed at the surface of the substrate with OLED devices by etching a silicon oxide layer on the topmost (i.e., the side closest to the light-emitting device) of the substrate (e.g., a silicon-based substrate), and the level differences formed by the recesses are used to disconnect the charge generation layers of adjacent sub-pixels, such that the charge generation layers of adjacent sub-pixels are not connected to each other, not in contact with each other, and not electrically connected to each other. However, it is difficult to control the etching uniformity of the silicon oxide layer on the silicon-based substrate, and the depths of the recesses of the plurality of sub-pixels of the entire display panel in the direction perpendicular to the substrate cannot be accurately controlled to be consistent, which results in uneven etching depths of the recesses in the entire display region, and forms Mura defect. In this case, the microscopic observation shows that a cathode in some regions of the display region will form a puncture structure in the recess region, thereby causing a large leakage of the entire OLED device. However, in terms of the display panel 10 provided by the embodiment of the present disclosure, during the process of manufacturing the display panel 10, after the first electrodes 21 are formed, the first recess 40 is formed in the space SP between the first electrode 21 of the first sub-pixel 101 and the first electrode 21 of the second sub-pixel 102 by a patterning process (e.g., a photolithography process), and then the charge generation layers 3 are formed, such that the level difference formed by the first recess 40 in the direction perpendicular to the main surface 11 of the substrate 1 can be utilized to disconnect the charge generation layer 3 in the OLED device of the first sub-pixel 101 and the charge generation layer 3 in the OLED device of the second sub-pixel 102 from each other. In an actual process, the thicknesses of the first electrodes 21 of the plurality of sub-pixels 100 in the direction perpendicular to the main surface 11 of the substrate 1 and the shapes of the first electrodes 21 can be controlled to be uniform, while the thickness of the formed pixel definition layer 4 is also uniform, such that in the plurality of sub-pixels 100, the depths H of the first recesses 40 naturally formed depending on the shapes and thicknesses of the first electrodes 21 are uniform, as such, the extents to which the charge generation layers 3 of multiple sub-pixels 100 are disconnected from each other are uniform and consistent, which plays a very important role in improving the display uniformity of the display panel 10, and preventing Mura defect.

For example, the substrate 1 is a silicon-based substrate, the silicon-based substrate includes an insulation layer and vias VI (such as tungsten vias) penetrating through the insulation layer, the first electrodes 21 are connected to the connection electrodes 12 through the vias VI, and the connection electrodes 12 are connected to the first electrodes of driving transistors of the pixel circuits fabricated in the silicon-based substrate. The pixel circuit includes, for example, thin film transistor(s) and storage capacitor(s), and further includes, for example, data transistor(s), compensation transistor(s), or the like. For example, the pixel circuit may be 3T1C, 7T1C, 9T2C pixel circuit, or the like, and the present disclosure does not limit the specific type of the pixel circuit.

For example, as shown in FIG. 2, in each sub-pixel 100, a first light-emitting element 61 and a second light-emitting element 62 are included. The first light-emitting element 61 emits light of a first color, the second light-emitting element 62 emits light of a second color, and the first color is different from the second color; the charge generation layer 3 is located between the first light-emitting element 61 and the second light-emitting element 62, and connected to the first light-emitting element 61 and the second light-emitting element 62, such that the excitons emit twice the amount of excitons under the action of an electric field, thereby achieving more than twice the photoelectric conversion efficiency. Since the charge generation layer 3 is more conductive than other functional layers in the OLED device, pixel crosstalk in the lateral direction (the arrangement direction of the sub-pixels) may be caused. Therefore, it is necessary to disconnect the charge generation layers 3 of adjacent sub-pixels to avoid crosstalk between adjacent sub-pixels.

For example, the light emitted by the light-emitting device is combined into white light; for example, each sub-pixel 100 of the display panel further includes a color filter, and in each sub-pixel 100, the color filter is located on a side of the light-emitting device away from the substrate 1, and the light emitted by the first light-emitting element 61 and the light emitted by the second light-emitting element 62 are combined into white light, and after the white light is filtered by the color filters of the corresponding sub-pixels 100, different sub-pixels emit light of different colors. For example, the first color is yellow and the second color is blue. For example, as shown in FIG. 1, three consecutive sub-pixels 100 constitute a pixel 10*a*, and the colors of the color filters in the three sub-pixels 100 in each pixel 10*a* are red (R), green (G) and blue (B), respectively; moreover, the colors of the light emitted by the first light-emitting elements 61 of the three sub-pixels 100 are the same, and all of the first light-emitting elements 61 in the three sub-pixels 100 emit light of the first color; the colors of the light emitted by the second light-emitting elements 62 of the three sub-pixels 100 are the same, and all of the second light-emitting elements 62 in the three sub-pixels 100 emit light of the second color. In the three sub-pixels 100 of one pixel, the light of the first color and the light of the second color are combined into white light, and after the white light pass through the red (R) color filter, the green (G) color filter and the blue (B) color filter respectively, a red light, a green light and a blue light are respectively emitted from the three sub-pixels 100. Certainly, the first color and the second color are not limited to the types listed above, and the extension of the color filter is not limited to the types listed above, which are not limited in the present disclosure.

For example, for each sub-pixel 100, the first electrode 21 includes a metal electrode layer and a transparent electrode layer 21*d* stacked in a direction perpendicular to the main surface 11, and the transparent electrode layer 21*d* covers the metal electrode layer. For example, the metal electrode layer is a Ti/Al/Ti stack structure. That is, as shown in FIG. 2, the metal electrode layer includes a first sublayer 21*a*, a second sublayer 21*b*, and a third sublayer 21*c* stacked on the main surface of the substrate 1, for example, the material of the first sublayer 21*a* is metal titanium (Ti), the material of the second sublayer 21*b* is metal aluminum (Al), and the material of the third sublayer 21*c* is metal titanium (Ti), thereby forming the Ti/Al/Ti stack structure constituted by the first sublayer 21*a*, the second sublayer 21*b* and the third sublayer 21*c*. For example, the material of the transparent electrode layer 21*d* 21 is a transparent conductive material, such as ITO, IZO or the like.

For example, the thicknesses T1 of the first electrodes 21 of the plurality of sub-pixels 100 in the direction perpendicular to the main surface 11 are equal, and the thickness of the first electrode 21 of each of the plurality of sub-pixels is not less than 450 μm, so as to ensure that the first recess 40 formed depending on the thickness of the first electrode 21 has sufficient depth, and thereby ensuring that the charge generation layers 3 in the OLED devices of the first sub-pixel 101 and the second sub-pixel 102 can be effectively disconnected from each other, that is, ensuring the reliability of the disconnection between the charge generation layers 3 of the adjacent sub-pixels, and improving the yield of the display panel.

For example, the depth of the first recess 40 in the direction perpendicular to the main surface 11 is not less than 900 μm, that is, the first recess 40 has enough depth to ensure that the effect of disconnection of the charge generation layers 3 in the OLED devices of the first sub-pixel 101 and the second sub-pixel 102 from each other is good, that is, the reliability of disconnection of the charge generation layers 3 of adjacent sub-pixels from each other is ensured, and the yield of the display panel is improved.

For example, the first electrodes 21 of a plurality of sub-pixels 100 (e.g., all of the sub-pixels 100) of the entire display panel 10 have the same thickness in the direction perpendicular to the main surface 11 of the substrate 1, such that the depths H of the plurality of first recesses 40 of the display panel 10 in the direction perpendicular to the main surface 11 of the substrate 1 are equal. For example, in the embodiment illustrated in FIG. 2, the thickness of the first electrode 21 in the direction perpendicular to the main surface 11 of the substrate 1 refers to the sum of the thicknesses of the metal electrode layer and the transparent electrode layer. Therefore, in the embodiment illustrated in FIG. 2, the thickness of the first electrode 21 in the direction perpendicular to the main surface 11 of the substrate 1 is the sum of the thickness of the stack structure constituted by the first sublayer 21*a*, the second sublayer 21*b* and the third sublayer 21*c* and the thickness of the transparent electrode layer 21*d* in the direction perpendicular to the main surface 11 of the substrate 1.

For example, as shown in FIG. 2, the pixel definition layer 4 includes a spacing part 401, a first stack part 41 and a second stack part 42. The spacing part 401 is located in the space SP between the first electrode 21 of the first sub-pixel 101 and the first electrode 21 of the second sub-pixel 102; the first stack part 41 is stacked on the side of the first electrode 21 of the first sub-pixel 101 away from the substrate 1 in the direction perpendicular to the main surface 11; the second stack part 42 is stacked on the side of the first electrode 21 of the second sub-pixel 102 away from the substrate 1 in a direction perpendicular to the main surface 11, the spacing part 401 includes the first recess 40.

For example, as shown in FIG. 2, the main surface 11 of the substrate 1 has a middle portion 1*a* located at the space SP, the middle portion 1*a* of the main surface 11 is flat, that is, there is no recess existed in the main surface 11 at the space SP, and the spacing part 401 of the pixel definition layer 4 is located on the middle portion 1*a* of the main surface 11; for example, the entire main surface 11 is flat. The first recess 40 has a first bottom surface 40*a* substantially parallel to the main surface 11, so as to ensure that the spacing part 401 of the pixel definition layer 4 is formed on the flat surface of the middle portion 1*a* of the main surface 11, such that the first recess 40 also has a flat first bottom surface 40*a*, as such, the level difference formed by the uniform depth of the first recess 40 can be utilized to disconnect the charge generation layers 3 in the OLED devices of the first sub-pixel 101 and the second sub-pixel 102 from each other.

For example, the entire first bottom surface 40*a* of the first recess 40 is a continuous surface, that is, there is no recess, opening, etc., existed to disconnect the first bottom surface 40*a*, that is, the first bottom surface 40*a* is a surface formed according to the topography of the flat middle portion 1*a* of the main surface 11.

For example, as shown in FIG. 2, the display panel 10 further includes a floating charge generation layer 30, the floating charge generation layer 30 is located in the first recess 40 and on the first bottom surface 40*a*, and the material of the floating charge generation layer 30 is the same as the materials of the charge generation layers 30 of the first sub-pixel 101 and the second sub-pixel 102; the charge generation layer 3 of the first sub-pixel 101 is located on the side of the first stack part 41 away from the main surface 11, and the charge generation layer 3 of the second sub-pixel 102 is located on the side of the second stack part 42 away from the main surface 11; the charge generation layer 3 of the first sub-pixel 101 is disconnected from the floating charge generation layer 30, and the charge generation layer 3 of the second sub-pixel 102 is disconnected from the floating charge generation layer 30, that is, the charge generation layers 3 of adjacent sub-pixels are disconnected from each other through the level difference formed by the depth of the first recess 40.

For example, as shown in FIG. 2, the distance from the floating charge generation layer 30 to the main surface 11 is less than the distance from the upper surface of the first portion 41 of the pixel definition layer 4 away from the substrate 1 to the main surface 11, and is less than the distance from the upper surface of the second portion 42 of the pixel definition layer 4 away from the substrate 1 to the main surface 11, that is, level differences are existed between the floating charge generation layer 30 and both the upper surfaces of the first portion 41 and the second portion 42 of the pixel definition layer 4 away from the substrate 1 in a direction perpendicular to the main surface 11, so as to ensure the reliability of the disconnection effect between the charge generation layer 3 of the first sub-pixel 101 and the charge generation layer 3 of the second sub-pixel 102.

For example, as shown in FIG. 2, the first stack part 41, the spacing part 401 and the second stack part 42 form a continuous integrated structure. For example, the spacing part 401 of the pixel definition layer 4 covers and directly contacts the side surface of the first electrode 21 of the first sub-pixel 101 close to the first electrode 21 of the second sub-pixel 102, the flat middle part 1*a* of the main surface 11, and the side surface of the first electrode 21 of the second sub-pixel 102 close to the first electrode 21 of the first sub-pixel 101; the first stack part 41 covers and directly contacts a portion of the upper surface of the first electrode 21 of the first sub-pixel 101 away from the substrate 1; the second stack part 42 covers and directly contacts a portion of the upper surface of the first electrode 21 of the second sub-pixel 102 away from the substrate 1.

For example, an edge of the orthographic projection of the charge generation layer 3 of the first sub-pixel 101 on the main surface 11 close to the second sub-pixel 102 and an edge of the orthographic projection of the floating charge generation layer 30 on the main surface 11 close to the first sub-pixel 101 are connected to each other (e.g., coincide with each other), an edge of the orthographic projection of the charge generation layer 3 of the second sub-pixel 101 on the main surface 11 close to the first sub-pixel 102 and an edge of the orthographic projection of the floating charge generation layer 30 on the main surface 11 close to the second sub-pixel 101 are connected to each other (e.g., coincide with each other).

For example, as shown in FIG. 2, the ratio of the thickness T1 of the first electrode 21 of the first sub-pixel 101 in the direction perpendicular to the main surface 11 to the thickness T3 of the pixel definition layer 4 in the direction perpendicular to the main surface 11, and the ratio of the thickness T2 (e.g., T1=T2) of the first electrode 21 of the second sub-pixel 102 in the direction perpendicular to the main surface 11 to the thickness T3 of the pixel definition layer 4 in the direction perpendicular to the main surface 11 are both not less than 2. For example, the first portion 41, the spacing part 401 and the second portion 42 of the pixel definition layer 4 have the same thickness. In this way, after the first electrode 21 of the first sub-pixel 101 and the first electrode 21 of the second sub-pixel 102 are formed, the first recess 40 in the pixel definition layer 4 which is naturally formed by deposition depending on the thicknesses and topography of the first electrode 21 of the first sub-pixel 101 and the first electrode 21 of the second sub-pixel 102 can be ensured to have a sufficient depth, such that the charge generation layer 3 of the first sub-pixel 101 and the charge generation layer 3 of the second sub-pixel 102 are disconnected from each other.

For example, as shown in FIG. 2, the light-emitting device further includes a hole injection layer (HIL) 5. The hole injection layer 5 is located on the side of the first electrode 21 away from the substrate, for example, the hole injection layer 5 is in direct contact with the first electrode 21. The hole injection layer 5, the first light-emitting element 61, the charge generation layer 3 and the second light-emitting element 62 are sequentially arranged along the direction from a location close to the substrate 1 to a location away from the substrate 1.

For example, as shown in FIG. 2, the hole injection layer 5 of the first sub-pixel 101 and the hole injection layer 5 of the second sub-pixel 102 are disconnected from each other, for example, disconnected from each other at the first recess 40. Since the hole injection layer 5 is more conductive than other functional layers in the OLED device, and has a greater impact on the performance of the OLED device, and thus will cause pixel crosstalk in the lateral direction, that is, the arrangement direction of the sub-pixels, it is necessary to disconnect the hole injection layers 5 in adjacent sub-pixels to prevent crosstalk between adjacent sub-pixels. In the process of manufacturing the hole injection layers 5, the hole injection layers 5 in the OLED devices of the first sub-pixel 101 and the second sub-pixel 102 are disconnected from each other by utilizing the level difference formed by the uniform depth of the first recess 40, such that the structures of the functional layers of multiple sub-pixels are uniform. And, as shown in FIG. 2, the light-emitting device further includes a floating hole injection layer 50, the floating hole injection layer 50 is located in the first recess 40 and on the first bottom surface 40*a*, for example, the floating hole injection layer 50 is in contact with the first bottom surface 40*a*, and the material of the floating hole injection layer 50 is the same as the materials of the hole injection layer 50 of the first sub-pixel 101 and the hole injection layer 50 of the second sub-pixel 102. For example, the distance from the floating hole injection layer 50 to the main surface 11 is less than the distance from the first portion 41 of the pixel definition layer 4 to the main surface 11, and less than the distance from the second portion 42 of the pixel definition layer 4 to the main surface 11, that is, level differences are existed between the floating hole injection layer 50 and both the upper surfaces of the first portion 41 and the second portion 42 of the pixel definition layer 4 away from the substrate 1 in the direction perpendicular to the main surface 11, such that the level difference between the floating hole injection layer 50 and the hole injection layer 5 of the first sub-pixel 101, and the level difference between the floating hole injection layer 50 and the hole injection layer 5 of the first sub-pixel 101 can be further utilized in subsequent process, such that the charge generation layer 3 of the second sub-pixel 101 and the charge generation layer 3 of the second sub-pixel 102 formed on the side of the hole injection layers 5 away from the substrate 1 are disconnected from each other, and the reliability of the disconnection therebetween can be ensured.

For example, similarly, the light-emitting device further includes a floating first light-emitting layer 60, the floating first light-emitting layer 60 is located in the first recess 40 and on the first bottom surface 40*a*, and the material of the floating first light-emitting layer 60 is the same as the materials of the first light-emitting element 61 of the first sub-pixel 101 and the first light-emitting element 61 of the second sub-pixel 102. For example, the distance from the floating first light-emitting layer 60 to the main surface 11 is less than the distance from the upper surface of the first portion 41 of the pixel definition layer 4 away from the substrate 1 to the main surface 11, and is less than the distance from the upper surface of the second portion 42 of the pixel definition layer 4 away from the substrate 1 to the main surface 11, that is, level differences are existed between the floating first light-emitting layer 60 and both the upper surfaces of the first portion 41 and the second portion 42 of the pixel definition layer 4 away from the substrate 1 in the direction perpendicular to the main surface 11, so as to ensure that the level difference between the floating first light-emitting layer 60 and the first light-emitting element 61 of the first sub-pixel 101, and the level difference between the floating first light-emitting layer 60 and the first light-emitting element 61 of the second sub-pixel 102 can be continuously utilized in a subsequent process, such that the charge generation layer 3 of the first sub-pixel 101 and the charge generation layer 3 of second sub-pixel 102 formed on the side of the first light-emitting elements 61 away from the substrate 1 are disconnected from each other, and the reliability of the disconnection therebetween can be ensured.

For example, as shown in FIG. 2, for example, the second light-emitting element 62 covers the first sub-pixel 101 and the second sub-pixel 102, fills into the first recess 40 and is continuous. Since the second light-emitting element 62 is located on the side of the charge generation layers 3 away from the substrate 1, it is not necessary to disconnect the second light-emitting element 62 in the space SP between the first sub-pixel 101 and the second sub-pixel 102. For example, the surface of the second light-emitting element 62 away from the substrate 1 is a flat surface, which is similar to a planarized layer. Of course, in some other embodiments, the second light-emitting element 62 may also be disconnected in the space SP between the first sub-pixel 101 and the second sub-pixel 102.

For example, as shown in FIG. 2, the light-emitting device further includes a second electrode 22. For example, the first electrode is an anode, and the second electrode is a cathode. For example, the second electrode 22 is a common cathode at least covering the entire display region of the display panel.

For example, as shown in FIG. 2, the display panel 10 further includes an encapsulation layer 7, for example, the encapsulation layer 7 may include an inorganic encapsulation layer and/or an organic encapsulation layer.

The display region of the display panel 10 includes dummy sub-pixels, that is, floating sub-pixels, which do not perform display functions, and spaces are also existed between adjacent dummy sub-pixels, but the charge generation layers of adjacent dummy sub-pixels may not be disconnected in the space between adjacent dummy sub-pixels, and other functional layers such as the hole injection layer, the first light-emitting element of the tandem OLED may also not be disconnected in the space between adjacent dummy sub-pixels.

Figure 3:
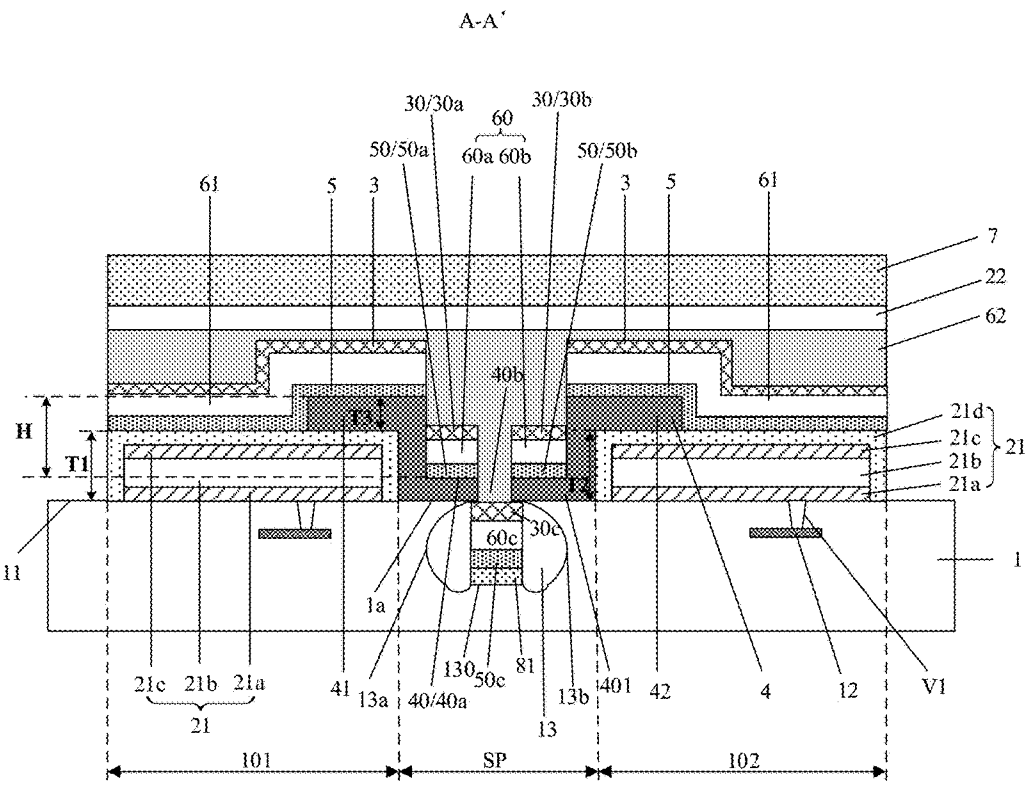
FIG. 3 is a schematic cross-sectional view of another display panel taken along the line A-A' in FIG. 1 according to an embodiment of the present disclosure.

FIG. 3 is a schematic cross-sectional view of another display panel along the line A-A' in FIG. 1 according to an embodiment of the present disclosure. The display panel illustrated in FIG. 3 has the following differences from the display panel illustrated in FIG. 2. As shown in FIG. 3, the main surface 11 has a middle portion 1*a* located at the space SP, the middle portion 1*a* of the main surface 11 has a second recess 13, and the spacing part 401 of the pixel definition layer 4 has a fracture 40*b* penetrating through the spacing part 401 at the second recess 13, the second recess 13 is connected to the first recess 40 through the fracture 40*b*; the second recess 13 has a second bottom surface 130 substantially parallel to the main surface 11, and the display panel 10 further includes a first etching stop layer 81, the first etching stop layer 81 is located in the second recess 13 and on the second bottom surface 130, and the material of the first etching stop layer 81 is different from the material of the substrate 1 and is different from the material of the pixel definition layer 4. In this way, the first etching stop layer 81 may be firstly formed, and then the pixel definition layer 4 is formed through a patterning process, for example, in the process of pattering the pixel definition layer 81 using an etching process such as wet etching, the etching stop layer 81 can prevent the second bottom surface 130 of the second recess 13 from being etched, such that a plurality of second recesses 13 in the entire display panel have the same depth, and the respective subsequent formed layers (e.g., the hole injection layers, charge generation layers) of the respective sub-pixels have uniform and consistent structures, thereby preventing Mura display defects and improving the display uniformity of the display panel. In addition to etching the material layer for forming the pixel definition layer 4, the etchant further etches portions of the recess wall of the second recess 13 that is not covered by the first etching stop layer 81, including continuously etching the side surfaces 13*a*/13*b* of the second recess 13 intersecting the second bottom surface 130 of the second recess 13, such that the side surfaces 13*a*/13*b* of the second recess 13 are recessed toward the direction away from the first etching stop layer 81, which is more advantaged for the disconnection of the film layers (e.g., the charge generation layers 3, the first light-emitting layers 61, the hole injection layers 5) of adjacent sub-pixels formed on the pixel definition layer 4 and in the first recess 40 in subsequent processes.

For example, the material of the substrate 1 illustrated in FIG. 3 is silicon oxide, silicon nitride, or the like, for example, the substrate 1 is the uppermost silicon oxide layer of a silicon-based substrate, that is, the second recess 13 is located in the uppermost silicon oxide layer of the silicon-based substrate. For example, the material of the first etching stop layer 81 is a transparent conductive material, such as ITO, IZO or the like.

For example, as shown in FIG. 3, the display panel 10 further includes a floating charge generation layer 30 located in the second recess 13 and on the side of the first etching stop layer 81 away from the second bottom surface 130, the material of floating charge generation layer 30 is the same as the materials of the charge generation layer 3 of the first sub-pixel 101 and the charge generation layer 3 of the second sub-pixel 102, the charge generation layer 3 of the first sub-pixel 101 is located on the side of the first stack part 41 away from the main surface 11, and the charge generation layer 3 of the second sub-pixel 102 is located on the side of the second stack part 42 away from the main surface 11; the charge generation layer 3 of the first sub-pixel 101 is disconnected from the floating charge generation layer 30, and the charge generation layer 3 of the second sub-pixel 102 is disconnected from the floating charge generation layer 30, so as to disconnect the charge generation layers of the adjacent sub-pixels 100.

For example, as shown in FIG. 3, the floating charge generation layer 30 includes a first portion 30*a* and a second portion 30*b* spaced apart from each other due to the level difference formed by the communication between the fracture 40*b* and the second recess 13, thereby further effectively ensuring that the charge generation layer 3 of the first sub-pixel 101 is completely disconnected from the charge generation layer 3 of the second sub-pixel 102. For example, the floating charge generation layer 30 further includes a third portion 30*c* located in the second recess 13.

For example, as shown in FIG. 3, the display panel 10 further includes a floating hole injection layer 50, the floating hole injection layer 50 includes a first portion 50*a* and a second portion 50*b*, and the first portion 50*a* and the second portion 50*b* are located in the first recess 40, the first portion 50*a* and the second portion 50*b* are spaced apart from each other due to the level difference formed by the communication between the fracture 40*b* and the second recess 13. The first portion 50*a* and the second portion 50*b* of the floating hole injection layer 50 are located on the bottom surface 40*a* and are respectively located on opposite sides of the fracture 40*b*. The first portion 50*a* of the floating hole injection layer 50 is stacked with the first portion 30*a* of the floating charge generation layer 30, and is located on the side of the first portion 30*a* of the floating charge generation layer 30 close to the spacing part 401 of the pixel definition layer 4; the second portion 50*b* of the floating hole injection layer 50 is stacked with the second portion 30*b* of the floating charge generation layer 30, and is located on the side of the second portion 30*b* of the floating charge generation layer 30 close to the spacing part 401 of the pixel definition layer 4. For example, the floating hole injection layer 50 further includes a third portion 50*c*, the third portion 50*c* is located in the second recess 13, and is located between the first etching stop layer 81 and the third portion 30*c* of the floating charge generation layer 30.

For example, as shown in FIG. 3, the display panel 10 further includes a floating light-emitting layer 60, the floating light-emitting layer 60 includes a first portion 60*a* and a second portion 60*b*, the first portion 60*a* and the second portion 60*b* are located in the first recess 40, and the first portion 60*a* and the second portion 60*b* are spaced apart from each other due to the level difference formed by the communication between the fracture 40*b* and the second recess 13. The first portion 60*a* and the second portion 60*b* of the floating light-emitting layer 60 are located on the bottom surface 40*a* and are respectively located on opposite sides of the fracture 40*b*. The first portion 60*a* of the floating light-emitting layer 60 is stacked with the first portion 30*a* of the floating charge generation layer 30 and the first portion 50*a* of the floating hole injection layer 50, and is located between the first portion 30*a* of the floating charge generation layer 30 and the first portion 50*a* of the floating hole injection layer 50; the second portion 60*b* of the floating light-emitting layer 60 is stacked with the second portion 30*b* of the floating charge generation layer 30 and the second portion 50*a* of the floating hole injection layer 50, and is located between the second portion 30*a* of the floating charge generation layer 30 and the second portion 50*b* of the floating hole injection layer 50. For example, the floating light-emitting layer 60 further includes a third portion 60*c*, the third portion 60*c* is located in the second recess 13, and is located between the third portion 50*c* of the floating hole injection layer 50 and the third portion 30*c* of the floating charge generation layer 30.

For example, as shown in FIG. 3, the first electrode 21 of each of the plurality of sub-pixels includes a metal electrode layer and a transparent electrode layer 21*d* stacked in a direction perpendicular to the main surface 11, the transparent electrode layer 21*d* covers the metal electrode layer, and the first etching stop layer 81 and the transparent electrode layer 21*d* are formed of the same material, and are disposed in the same layer. For example, the metal electrode layer is a Ti/Al/Ti stack structure. The first etching stop layer 81 and the transparent electrode layer 21*d* are formed of the same material and are disposed in the same layer, as such, the first etching stop layer 81 and the transparent electrode layer 21*d* can be formed by performing one patterning process on the same one layer. The specific structure of the first electrode 21 is the same as that in FIG. 2, and the details may refer to the previous descriptions.

For example, as shown in FIG. 3, the size of the second recess 13 in the direction parallel to the main surface 11 first gradually increases and then gradually decreases along the direction from the main surface 11 to the bottom surface 130 of the second recess 13, which is more advantaged for disconnecting the film layers (charge generation layers 3, first light-emitting layers 61, hole injection layers 5) of adjacent sub-pixels on the pixel definition layer 4 and in the first recess 40 from each other by the second recess 13 in subsequent processes.

For example, as mentioned above, in the display panel 10 illustrated in FIG. 3, the side surfaces 13*a*/13*b* of the second recess 13 are recessed toward the direction away from the first etching stop layer 81, which is more advantaged for disconnecting the layers (charge generation layers 3, first light-emitting layers 61, hole injection layers 5) of adjacent sub-pixels on the pixel definition layer 4 and in the first second 40 from each other in subsequent processes. The shape of the second recess 13 along the cross-section perpendicular to the main surface 11 is an irregular shape, and the irregular shape includes a bottom surface 130, a first side edge 13*a* and a second side edge 13*b*, the bottom surface 130 is substantially parallel to the main surface 11, and the first side edge 13*a* and the second side edge 13*b* face each other and intersect the bottom surface 130, the first side edge 13*a* is recessed toward the direction away from the second side edge 13*b*, and the second side edge 13*b* is recessed toward the direction away from the first side edge 13*a*.

Other unmentioned features of the embodiment illustrated in FIG. 3 are the same as those of the embodiment illustrated in FIG. 2, and can be referred to the descriptions of the embodiment illustrated in FIG. 2.

Figure 4:
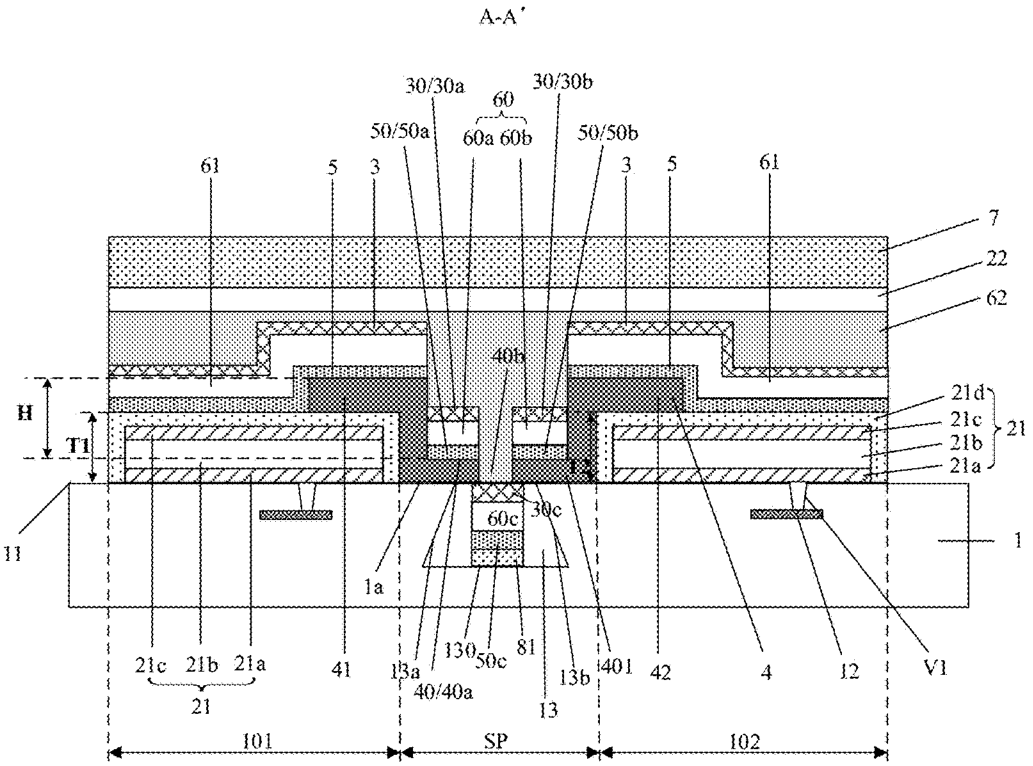
FIG. 4 is a schematic cross-sectional view of another display panel taken along the line A-A' in FIG. 1 provided by an embodiment of the present disclosure.

FIG. 4 is a schematic cross-sectional view of another display panel along the line A-A' in FIG. 1 according to an embodiment of the present disclosure. The display panel illustrated in FIG. 4 has the following differences from the display panel illustrated in FIG. 3. As shown in FIG. 4, for example, the size of the second recess 13 in the direction parallel to the main surface 11 gradually increases along the direction from the main surface 11 to the bottom surface 130 of the second recess 13; for example, the shape of second recess 13 along the cross-section perpendicular to the main surface 11 is trapezoid, which is more advantaged for disconnecting the film layers (charge generation layers 3, first light-emitting layers 61, hole injection layers 5) of adjacent sub-pixels on the pixel definition layer 4 and in the first second 40 from each other in subsequent processes. Of course, the shape of the second recess 13 along the cross-sectional perpendicular to the main surface 11 is not limited to trapezoid, as long as the size of the second recess 13 in the direction parallel to the main surface 11 gradually increases along the direction from the main surface 11 to the bottom surface 130 of the second recess 13.

Other unmentioned features of the embodiment illustrated in FIG. 4 are the same as those of the embodiment illustrated in FIG. 3, and can be referred to the descriptions of the embodiment illustrated in FIG. 3.

Figure 5:
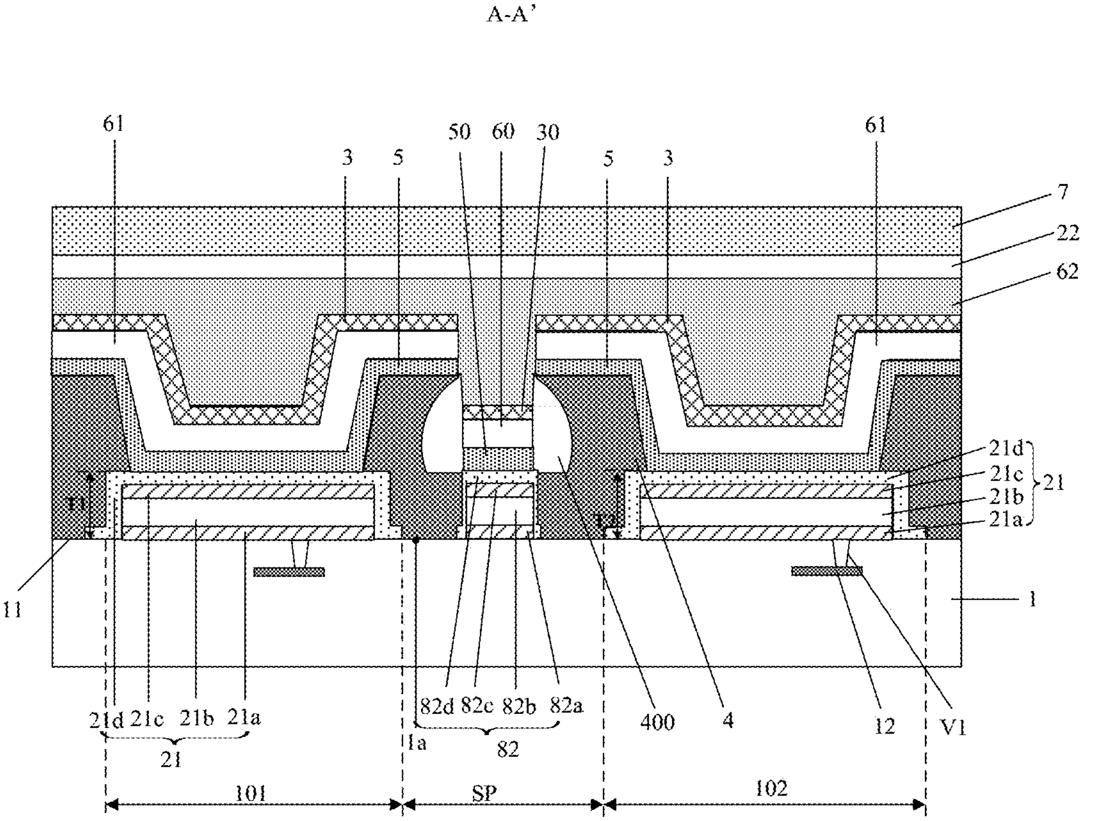
FIG. 5 is a schematic cross-sectional view of yet another display panel taken along the line A-A' in FIG. 1 according to an embodiment of the present disclosure.

FIG. 5 is a schematic cross-sectional view of another display panel along the line A-A' in FIG. 1 according to an embodiment of the present disclosure. The display panel illustrated in FIG. 5 has the following differences from the display panel illustrated in FIG. 2. As shown in FIG. 5, for example, the display panel 10 includes a second etching stop layer 82, the second etching stop layer 82 is located on the main surface 11 and in the space SP, the second etching stop layer 82, the first electrode 21 of the first sub-pixel 101 and the first electrode 21 of the second sub-pixel 102 are formed of the same material, disposed in the same layer and spaced apart from each other; the first recess 400 is located on the side of the second etching stop layer 82 away from the substrate 1, and exposes at least a portion of the upper surface of the second etching stop layer 82 away from the substrate 1. Therefore, the level difference formed by the first recess 400 in the direction perpendicular to the main surface 11 of the substrate 1 can be utilized to disconnect the charge generation layer 3 in the OLED device of the first sub-pixel 101 and the charge generation layer 3 in the OLED device of the second sub-pixel 102 from each other. Further, the second etching stop layer 82 has a fixed thickness, and can prevent a portion of the substrate 1 masked by the second etching stop layer 82 from being etched in the subsequent etching process, such as the etching process for forming the pixel definition layer 4, such that the first recesses 40 between adjacent sub-pixels can have the same depth through controlling the thicknesses of the second etching stop layers 82 between adjacent sub-pixels 100 in the direction perpendicular to the main surface 11 to be equal, thereby ensuring that the subsequently formed multiple sub-pixels have uniform and consistent functional layer structures, preventing Mura defects, and improving display uniformity of the display panel.

For example, the thickness of the second etching stop layer 82 in the direction perpendicular to the main surface 11 is equal to the thicknesses T1/T2 of the first electrodes 21 in the direction perpendicular to the main surface 11; for example, the thicknesses of the first electrodes 21 of the plurality of sub-pixels in the direction perpendicular to the main surface 11 are equal, which is advantaged for improving the display uniformity of the display panel.

For example, the hole injection layer 5 of the first sub-pixel 101 and the hole injection layer 5 of the second sub-pixel 102 are disconnected from each other, for example, disconnected from each other at the first recess 400; the first light-emitting layer 61 of the first sub-pixel 101 and the first light-emitting element 61 of the second sub-pixel 102 are disconnected from each other at, for example, the first recess 400. The hole injection layer 5, the first light-emitting element 61, the charge generation layer 3 and the second light-emitting element 62 are sequentially arranged along a direction from a location close to the substrate 1 to a location away from the substrate 1. The floating hole injection layer 50, the floating light-emitting layer 60 and the floating charge generation layer 30 are located in the first recess 400 and sequentially stacked on the surface of the second etching stop layer 82 away from the substrate 1. The hole injection layer 5 of the first sub-pixel 101 and the hole injection layer 5 the second sub-pixel 102 are disconnected to each other by the first recess 400, and the first light-emitting element 61 of the first sub-pixel 101 and the first light-emitting elements 61 of the second sub-pixel 102 are disconnected to each other by the first recess 400. The hole injection layers 5, the first light-emitting elements 61, the charge generation layers 3 and the second light-emitting element 62 are arranged in sequence. For example, the second light-emitting element 62 covers the first sub-pixel 101 and the second sub-pixel 102, partially fills the first recess 400 and is continuous. For example, in some other embodiments, the second light-emitting element 62 may also fill the entire first recess 400, and other features of the second light-emitting element 62 are similar to those described with respect to FIG. 2.

For example, the distance from the floating charge generation layer 30 to the main surface 11 is less than the distance from the first portion 41 of the pixel definition layer 4 to the main surface 11, and less than the distance from the second portion 42 of the pixel definition layer 4 to the main surface 11, so as to ensure the effect that the charge generation layer 3 of the first sub-pixel 101 and the charge generation layer 3 of the second sub-pixel 102 are disconnected from each other. Of course, in some other embodiments, the distance from the floating charge generation layer 30 to the main surface 11 may be greater than or equal to the distance from the first portion 41 of the pixel definition layer 4 to the main surface 11, and less than the distance from the second portion 42 of the pixel definition layer 4 to the main surface 11, as long as the charge generation layer 3 of the first sub-pixel 101 and the charge generation layer 3 of the second sub-pixel 102 are disconnected from each other.

For example, the size of the second etching stop layer 82 in the direction parallel to the main surface 11 is less than the size of the first electrode 21 of the first sub-pixel 101 in the same direction parallel to the main surface 11, and less than the size of the first electrode 21 of the second sub-pixel 102 in the same direction parallel to the main surface 11, so as to save space and meet the requirement of high PPI.

For example, the size of the first recess 400 in the direction parallel to the main surface 11 first gradually increases and then gradually decreases along the direction from a location away from the main surface 11 to a location close to the main surface 11, which is more advantaged for disconnecting the layers (charge generation layers 3, first light-emitting layers 61, hole injection layers 5) of adjacent sub-pixels on the pixel definition layer 4 from each other.

Alternatively, in some other embodiments, the size of the first recess 400 in the direction parallel to the main surface 11 gradually increases, which is more advantaged for disconnecting the film layers (charge generation layers 3, first light-emitting layers 61, hole injection layers 5) of adjacent sub-pixels on the pixel definition layer 4 from each other. For example, the shape of the first recess along the cross-section perpendicular to the main surface 11 is a trapezoid, of course the shape is not limited to trapezoid.

Other unmentioned features of the embodiment illustrated in FIG. 5 are the same as those of the embodiments illustrated in FIG. 2 and FIG. 3, and can be referred to the descriptions of the embodiments illustrated in FIG. 2 and FIG. 3.

Figure 6:
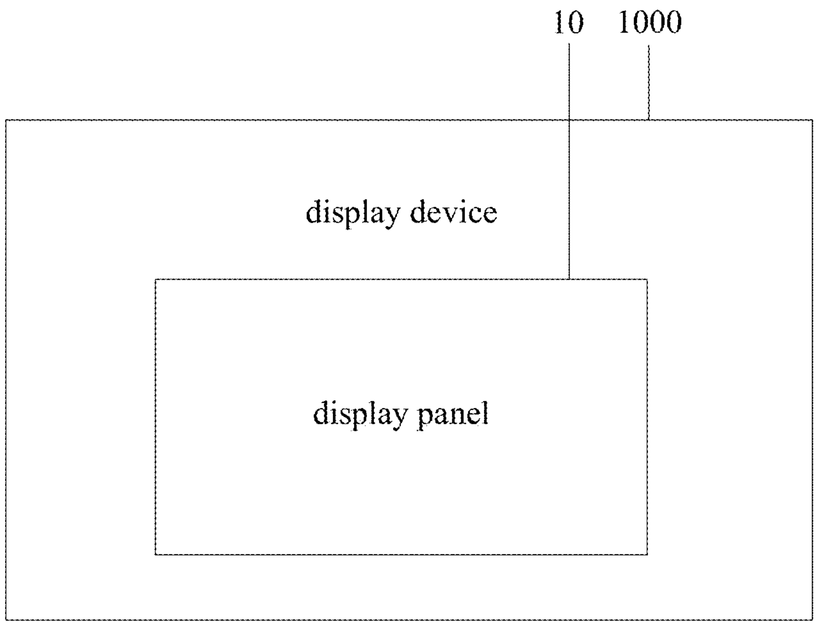
FIG. 6 is a schematic view of a display apparatus provided by at least one embodiment of the present disclosure.

FIG. 6 is a schematic view of a display apparatus provided by at least one embodiment of the present disclosure. As shown in FIG. 6, at least one embodiment of the present disclosure further provides a display apparatus 1000, and the display apparatus 1000 includes any one of the display panels 10 provided by the embodiments of the present disclosure. The display apparatus 1000 may be, for example, a device having display function such as a tandem organic light-emitting diode display apparatus or other types of devices. The embodiments of the present disclosure do not limit the type of the display apparatus.

The structure, function and technical effect of the display apparatus provided by the embodiments of the present disclosure may be referred to the corresponding descriptions with respect to the display panel 10 in the above embodiments of the present disclosure, and the details are not repeated here.

For example, the display apparatus 1000 provided by at least one embodiment of the present disclosure may be any product or component with display function, such as a mobile phone, a tablet computer, a television, a monitor, a notebook computer, a digital photo frame, a navigator, or the like, which is not limited by the embodiments of the present disclosure.

At least one embodiment of the present disclosure further provides a method of manufacturing a display panel, the method comprises: providing a substrate, in which the substrate has a main surface; forming a plurality of sub-pixels on the substrate, in which each sub-pixel of the plurality of sub-pixels comprises a light-emitting device on the main surface, and the light-emitting device comprises a first electrode and a charge generation layer that are stacked in a direction perpendicular to the main surface, the charge generation layer is on a side of the first electrode away from the substrate; and forming a pixel definition layer, in which the pixel definition layer is on the main surface and defines a plurality of opening regions, the plurality of opening regions are in one-to-one correspondence with the plurality of sub-pixels, and expose at least part of first electrodes of corresponding sub-pixels of the plurality of sub-pixels; the plurality of sub-pixels comprises a first sub-pixel and a second sub-pixel adjacent to each other, and a space is between the first electrode of the first sub-pixel and the first electrode of the second sub-pixel, the pixel definition layer comprises a first recess which is in the space and recessed toward the main surface, the charge generation layer of the first sub-pixel is spaced apart from the charge generation layer of the second sub-pixel by the first recess; the pixel definition layer comprises a plurality of first recesses located in spaces between different adjacent two sub-pixels among the plurality of sub-pixels, and depths of the plurality of first recesses in the direction perpendicular to the main surface are equal.

For example, FIG. 7A to FIG. 7H are schematic views illustrating a method of manufacturing the display panel shown in FIG. 2 provided by an embodiment of the present disclosure, the manufacturing method of the display panel will be described below with reference to FIG. 7A to FIG. 7H. Herein, two adjacent sub-pixels of the display panel, that is, the first sub-pixel 101 and the second sub-pixel 102 are taken as an example for introduction, which is the same for other sub-pixels.

Figure 7A:
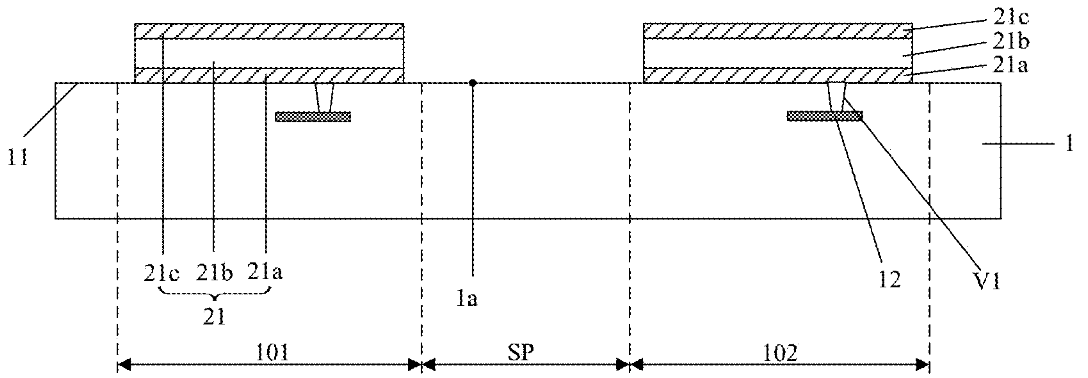
FIG. 7A to FIG. 7H are schematic views illustrating a manufacturing method of a display panel provided by an embodiment of the present disclosure.

As shown in FIG. 7A, a substrate 1 is provided, and the substrate 1 has a main surface 11. For example, the material of the substrate 1 is silicon oxide, silicon nitride, or the like, for example, the substrate 1 is the uppermost silicon oxide layer of a silicon-based substrate. The manufacturing method of the display panel includes: forming a plurality of sub-pixels on the substrate 1, in which each sub-pixel of the plurality of sub-pixels includes a light-emitting device located on the main surface 11; forming a metal electrode material layer on the main surface 11, for example, the metal electrode material layer includes a plurality of stacked metal layers; performing a patterning process on the metal electrode material layer to form a metal electrode layer of the first electrode 21 of the first sub-pixel 101 and a metal electrode layer of the first electrode 21 of the second sub-pixel 102. For example, the metal electrode layer is a Ti/Al/Ti stack structure. That is, as shown in FIG. 7A, the metal electrode layer includes a first sublayer 21*a*, a second sublayer 21*b*, and a third sublayer 21*c* stacked on the main surface of the substrate 1. For example, the material of the first sublayer 21*a* is metal titanium (Ti), the material of the second sublayer 21*b* is metal aluminum (Al), and the material of the third sublayer 21*c* is metal titanium (Ti), thereby the Ti/Al/Ti tack structure constituted by the first sublayer 21*a*, the second sublayer 21*b* and the third sublayer 21*c* is formed. A space SP is existed between the first electrode 21 of the first sub-pixel 101 and the first electrode 21 of the second sub-pixel 102, the main surface 11 has a middle portion 1*a* located in the space SP, and the middle portion 1*a* of the main surface 11 is flat, the first electrode 21 of the first sub-pixel 101 and the first electrode 21 of the second sub-pixel 102 expose a portion of the main surface 11 located in the space SP.

Figure 7B:
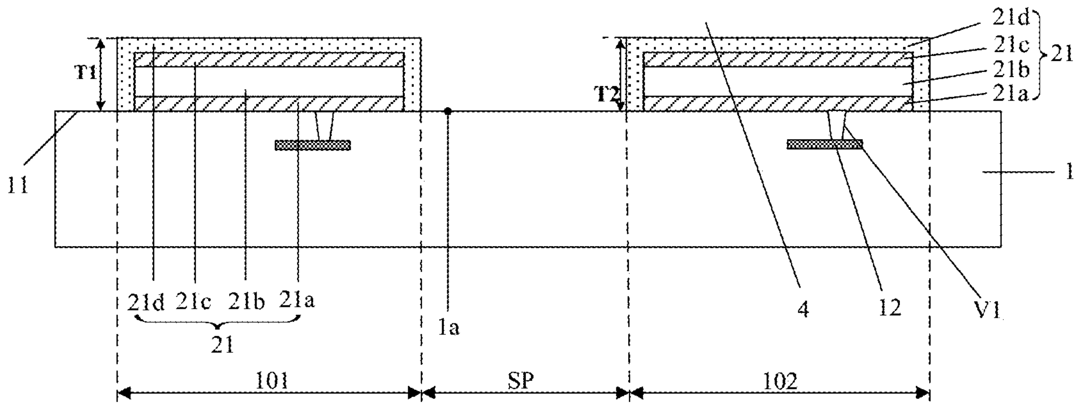

As shown in FIG. 7B, a transparent electrode layer 21*d* of the first electrode 21 is formed through a second patterning process, the transparent electrode layer 21*d* covers the metal electrode layer. For example, the material of the transparent electrode layer 21*d* is a transparent conductive material, such as ITO, IZO, or the like.

Figure 7C:
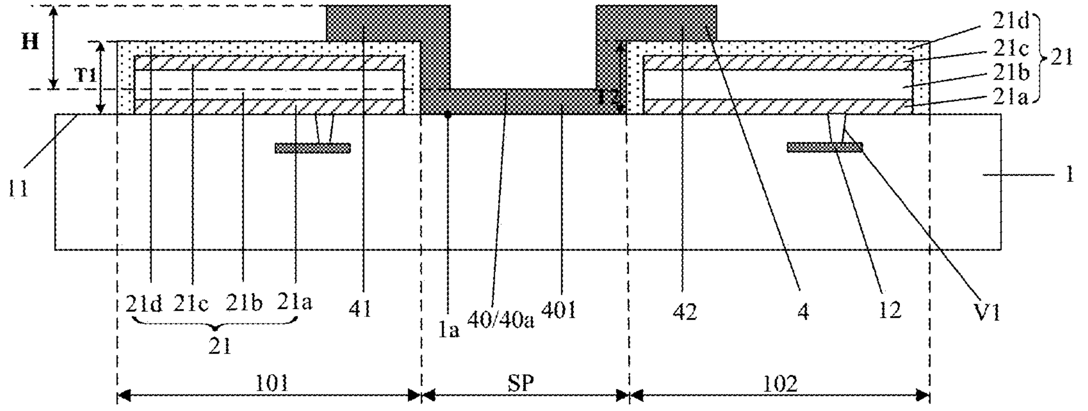

As shown in FIG. 7C, a pixel definition layer 4 is formed. The pixel definition layer 4 is located on the main surface 11, and the pixel definition layer 4 includes a first recess 40 located in the space SP and recessed toward the main surface 11, the charge generation layer 3 of the first sub-pixel 101 and the charge generation layer 3 of the second sub-pixel 102 are separated by the first recess 40; for example, the pixel definition layer 4 includes a plurality of first recesses 40, and a plurality of spaces SP are existed between the first electrodes of different adjacent two sub-pixels among the plurality of sub-pixels, the plurality of first recesses 40 are respectively located in the plurality of spaces SP in a one-to-one correspondence manner, that is, the pixel definition layer 4 includes a plurality of first recesses 40 located in the spaces SP between the first electrodes of different adjacent two sub-pixels among the plurality of sub-pixels, and the depths H of the plurality of first recesses 40 in a direction perpendicular to the main surface 11 are equal. For example, forming the first recess 40 includes the following processes: after the first electrode 21 of the first sub-pixel 101 and the first electrode 21 of the second sub-pixel 102 are formed on the main surface 11, a pixel definition material layer is formed on sides of the first electrode 21 of the first sub-pixel 101 and the first electrode 21 of the second sub-pixel 102 away from the substrate 1, so as to form the first recess 40 utilizing the thickness T1 of the first electrode 21 of the first sub-pixel 101 in the direction perpendicular to the main surface 11 and the thickness T2 (e.g., T1=T2) of the first electrode 21 of the second sub-pixel 102 in the direction perpendicular to the main surface 11, while forming the pixel definition material layer, without patterning the pixel definition material layer to form the first recess 40. For example, a deposition method is used to form the pixel definition material layer. Further, a patterning process is performed on the pixel definition layer 4 to form a plurality of openings, thereby forming the pixel definition layer 4, and the plurality of openings are in one-to-one correspondence with the plurality of sub-pixels 100 and expose at least part of the first electrodes 21 of the corresponding sub-pixels 100.

For example, the pixel definition layer 4 includes a spacing part 401, a first stack part 41 and a second stack part 42. The spacing part 401 is located in the space SP between the first electrode 21 of the first sub-pixel 101 and the first electrode 21 of the second sub-pixel 102; the first stack part 41 is stacked on the side of the first electrode 21 of the first sub-pixel 101 away from the substrate 1 in a direction perpendicular to the main surface 11; the second stack part 42 is stacked on the side of the first electrode 21 of the second sub-pixel 102 away from the substrate 1 in a direction perpendicular to the main surface 11, the spacing part 401 includes the first recess 40; the spacing part 401 of the pixel definition layer 4 covers and directly contacts a side surface of the first electrode 21 of the first sub-pixel 101 close to the first electrode 21 of the second sub-pixel 102, a portion of the main surface 11 located at the space SP, and a side surface of the first electrode 21 of the second sub-pixel 102 close to the first electrode 21 of the first sub-pixel 101; the first stack part 41 covers and directly contacts a portion of an upper surface of the first electrode 21 of the first sub-pixel 101 away from the substrate 1, and the second stack part 42 covers and directly contacts a portion of an upper surface of the first electrode 21 of the second sub-pixel 102 away from the substrate 1.

Figure 7D:
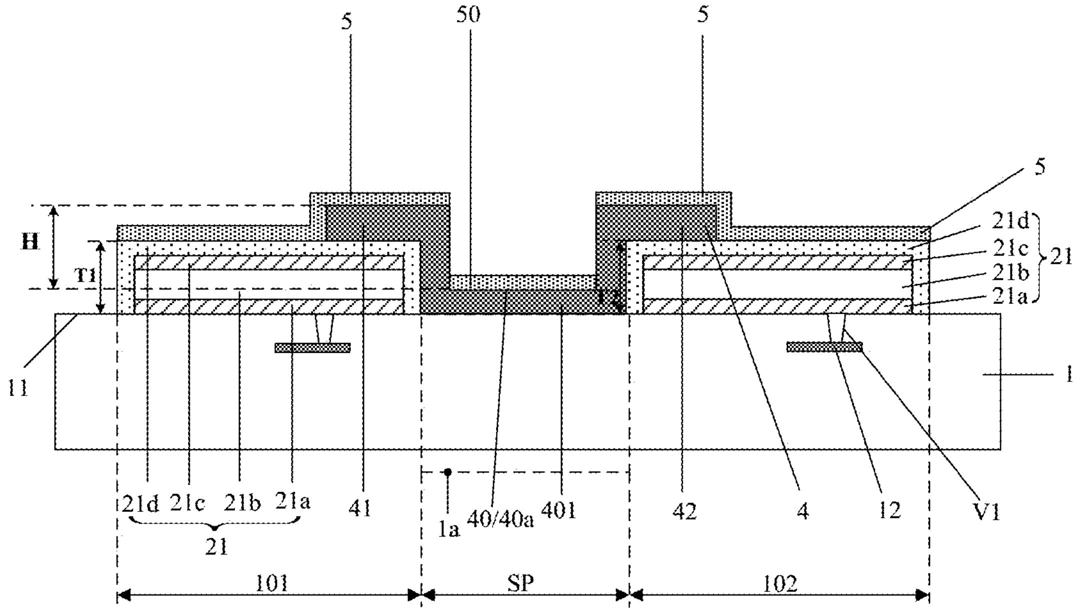

Thereafter, as shown in FIG. 7D, a hole injection layer 5 of the first sub-pixel 101, a hole injection layer 5 of the second sub-pixel 102 and a floating hole injection layer 50 are formed on the side of the pixel definition layer 4 away from the substrate 1 using the same one material and the same one layer forming process (e.g., the same one sputtering process); the first recess 40 has a first bottom surface 40*a* substantially parallel to the main surface 11, and the floating hole injection layer 50 is located in the first recess 40 and on the first bottom surface 40*a*, the hole injection layer 5 of the first sub-pixel 101 is located on a side of the first stack part 41 away from the main surface 11, and the hole injection layer 5 of the second sub-pixel 102 is located on a side of the second stack part 42 away from the main surface 11, furthermore, the hole injection layer 5 of the first sub-pixel 101 is disconnected from the floating hole injection layer 50, and the hole injection layer 5 of the second sub-pixel 102 is disconnected from the floating hole injection layer 50 by utilizing the depth H of the first recess 40 in the direction perpendicular to the substrate 1. Therefore, the level differences formed by the uniform depths of the first recesses 40 can be utilized such that the hole injection layers 5 of adjacent sub-pixels among the plurality of sub-pixels 100 are disconnected in a consistent manner.

For example, the distance from the floating hole injection layer 50 to the main surface 11 is less than the distance from the first portion 41 of the pixel definition layer 4 to the main surface 11, and less than the distance from the second portion 42 of the pixel definition layer 4 to the main surface 11, that is, level differences are existed between the floating hole injection layer 50 and both the upper surfaces of the first portion 41 and the second portion 42 of the pixel definition layer 4 away from the substrate 1 in a direction perpendicular to the main surface 11.

Figure 7E:
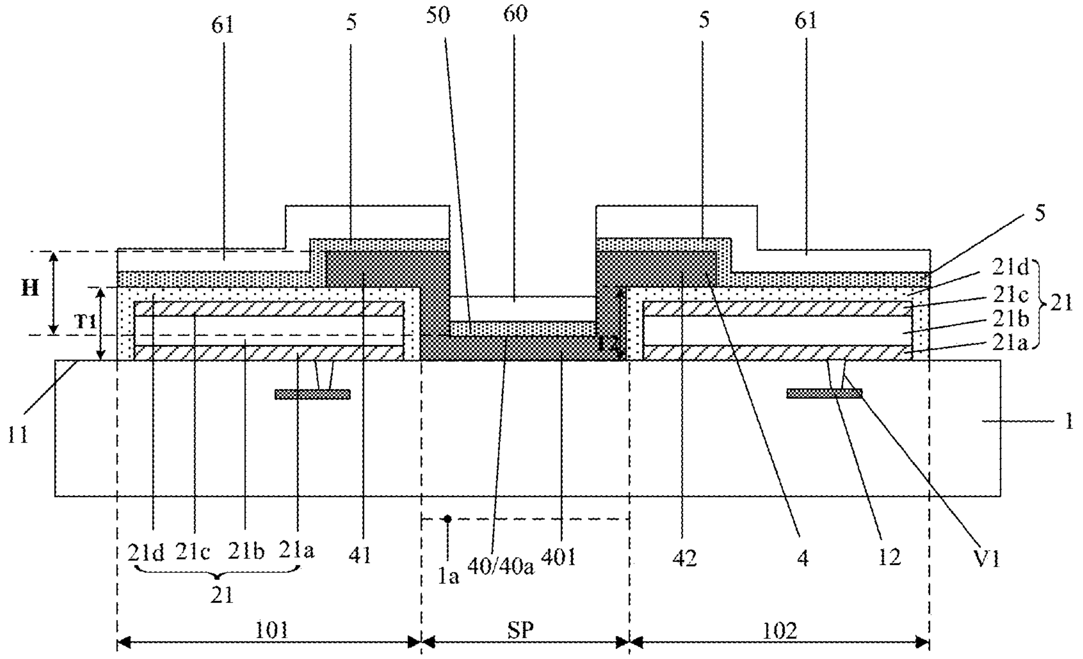

Thereafter, as shown in FIG. 7E, a first light-emitting element 61 of the first sub-pixel 101, a first light-emitting element 61 of the second sub-pixel 102 and a floating first light-emitting layer 60 are formed on the sides of the hole injection layers 5 away from the substrate 1 using the same one material and the same one layer forming process (e.g., including the same sputtering process, etc.); the first recess 40 has a first bottom surface 40*a* substantially parallel to the main surface 11, the floating first light-emitting layer 60 is located in the first recess 40 and stacked with the floating hole injection layer 50, furthermore, the first light-emitting element 61 of the first sub-pixel 101 is disconnected from the floating first light-emitting layer 60, and the first light-emitting element 61 of the second sub-pixel 102 is disconnected from the floating first light-emitting layer 60 by utilizing the depth H of the first recess 40 in the direction perpendicular to the substrate 1, that is, the first light-emitting element 61 of the first sub-pixel 101 and the first light-emitting element 61 of the second sub-pixel 102 formed on the side of the hole injection layers 5 away from the substrate 1 are disconnected from each other by utilizing the level difference between the floating hole injection layer 50 and the hole injection layer 5 of the first sub-pixel 101, and the level difference between the floating hole injection layer 50 and the hole injection layer 5 of the second sub-pixel 102. For example, the distance from the floating first light-emitting layer 60 to the main surface 11 is less than the distance from the upper surface of the first portion 41 of the pixel definition layer 4 away from the substrate 1 to the main surface 11, and less than the distance from the upper surface of the second portion 42 of the pixel definition layer 4 away from the substrate 1 to the main surface 11, that is, level differences are existed between the floating first light-emitting layer 60 and both the upper surfaces of the first portion 41 and the second portion 42 of the pixel definition layer 4 away from the substrate 1 in the direction perpendicular to the main surface 11.

Figure 7F:
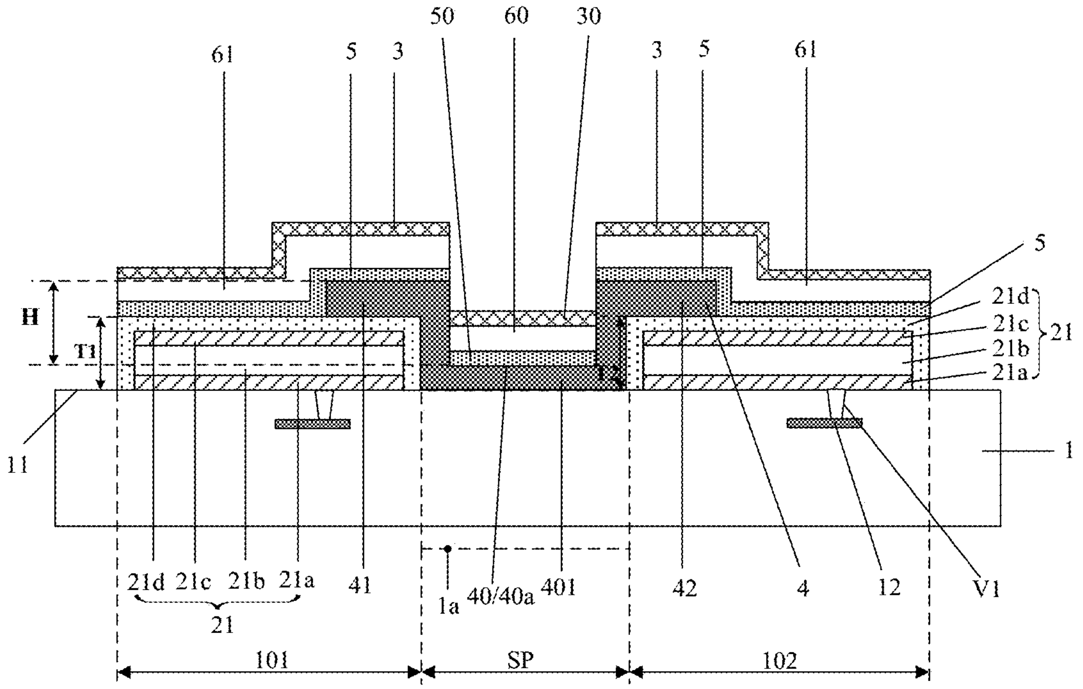

Thereafter, as shown in FIG. 7F, a charge generation layer 3 of the first sub-pixel 101, a charge generation layer 3 of the second sub-pixel 102 and the floating charge generation layer 30 are formed on the side of the pixel definition layer 4 away from the substrate 1 using the same one material and the same one layer forming process (e.g., including the same one sputtering process); the floating charge generation layer 30 is located in the first recess 40 and stacked with the floating hole injection layer 50 and the floating first light-emitting layer 60 on the first bottom surface 40*a*; the charge generation layer 3 of the first sub-pixel 101 is located on the side of the first stack part 41 away from the main surface 11, and the charge generation layer 3 of the second sub-pixel 102 is located on the side of the second stack part 42 away from the main surface 11, furthermore, the charge generation layer 3 of the first sub-pixel 101 is disconnected from the floating charge generation layer 30, and the charge generation layer 3 of the second sub-pixel 102 is disconnected from the floating charge generation layer 30 through utilizing the depth H of the first recess 40 in the direction perpendicular to the substrate 1, that is, the charge generation layer 3 of the first sub-pixel 101 and the charge generation layer 3 of the second sub-pixel 102 formed on the sides of the first light-emitting layers 61 away from the substrate 1 are disconnected from each other by utilizing the level difference between the floating first light-emitting layer 60 and the first light-emitting element 61 of the first sub-pixel 101, and the level difference between the floating first light-emitting layer 60 and the first light-emitting element 61 of the second sub-pixel 102, and the reliability of disconnection therebetween can be ensured.

Figure 7G:
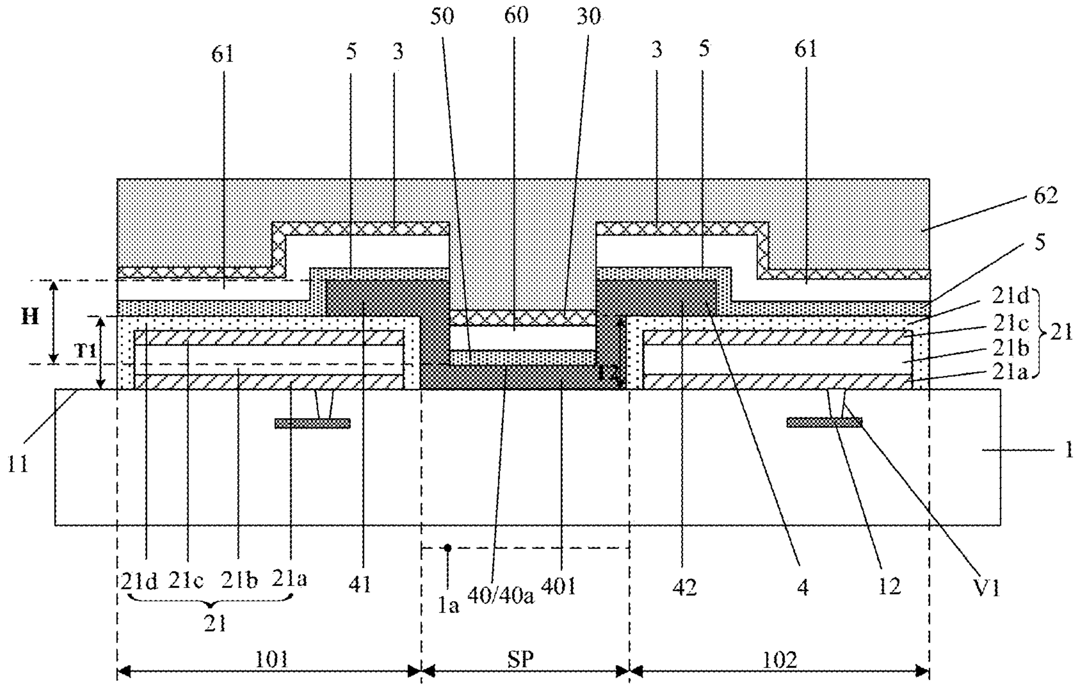

As shown in FIG. 7G, a second light-emitting element 62 is formed, for example, the second light-emitting element 62 covers the first sub-pixel 101 and the second sub-pixel 102, fills into the first recess 40 and is continuous. Since the second light-emitting element 62 is located on the side of the charge generation layers 3 away from the substrate 1, it is not necessary to disconnect the second light-emitting element 62 in the space SP between the first sub-pixel 101 and the second sub-pixel 102. For example, the surface of the second light-emitting element 62 away from the substrate 1 is a flat surface, which is similar to a planarized layer. Of course, in some other embodiments, the second light-emitting element 62 may also be disconnected in the space SP between the first sub-pixel 101 and the second sub-pixel 102.

Figure 7H:
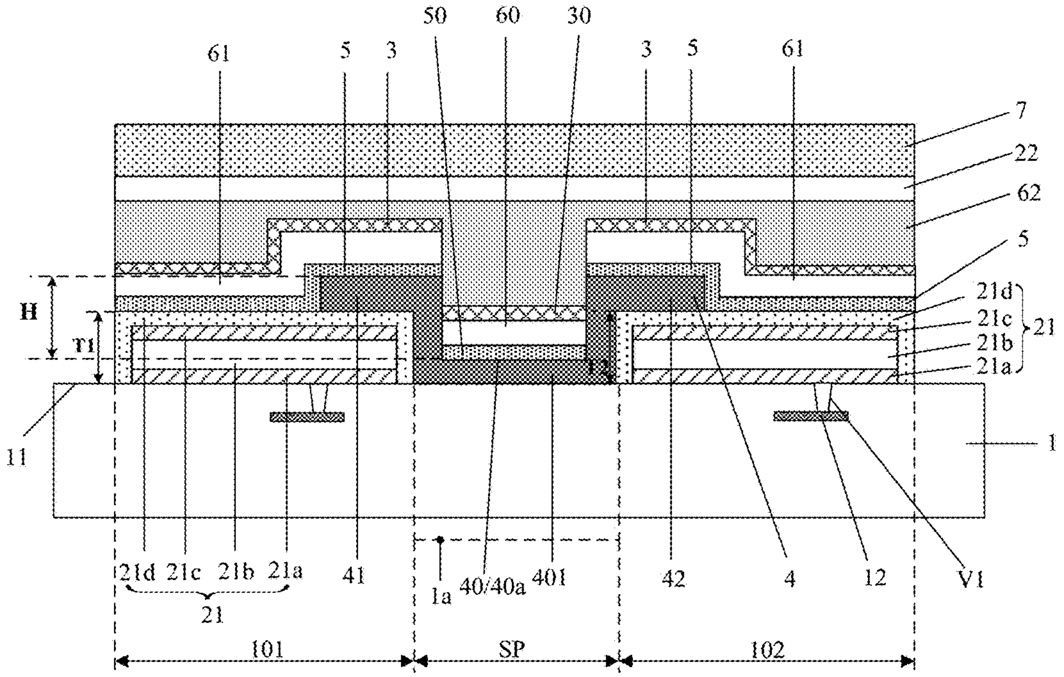

As shown in FIG. 7H, a second electrode 2 and an encapsulation layer 7 of the light-emitting device are sequentially formed, thereby the display panel shown in FIG. 2 is formed.

FIG. 8A to FIG. 8J are schematic views illustrating a method of manufacturing the display panel shown in FIG. 5 provided by an embodiment of the present disclosure. The manufacturing method of the display panel will be introduced below with reference to FIG. 8A to FIG. 8J. Herein, two adjacent sub-pixels of the display panel, that is, the first sub-pixel 101 and the second sub-pixel 102 are taken as an example for introduction, which is the same for other sub-pixels.

Figure 8A:
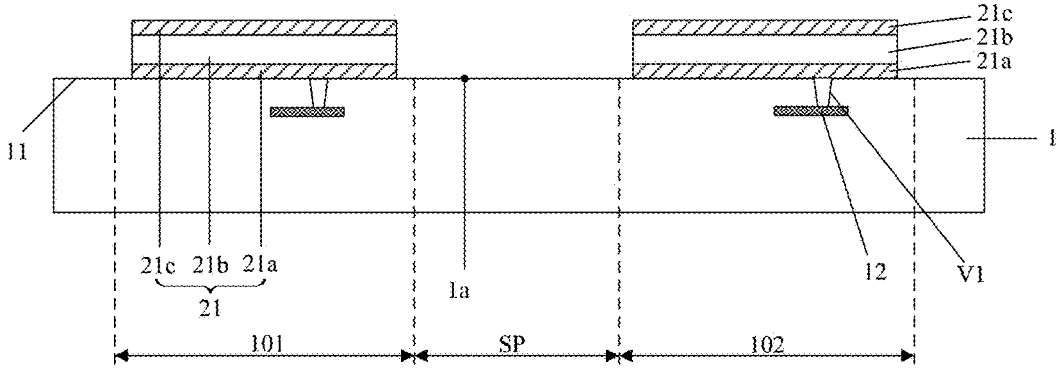
FIG. 8A to FIG. 8J are schematic views illustrating another manufacturing method of a display panel provided by an embodiment of the present disclosure.

As shown in FIG. 8A, a substrate 1 is provided, and the substrate 1 has a main surface 11. For example, the material of the substrate 1 is silicon oxide, silicon nitride, or the like, for example, the substrate 1 is the uppermost silicon oxide layer of a silicon-based substrate. The manufacturing method of the display panel includes the following processes: forming a plurality of sub-pixels on the substrate 1, in which each sub-pixel in the plurality of sub-pixels includes a light-emitting device located on the main surface 11; forming a metal electrode material layer (not shown) is on the main surface 11, for example, the metal electrode material layer includes a plurality of stacked metal layers, and a patterning process is performed on the metal electrode material layer to form a metal electrode layer of the first electrode 21 of the first sub-pixel 101 and a metal electrode layer of the first electrode 21 of the second sub-pixel 102. The details are the same as the processes illustrated in FIG. 7A, which can be referred to the previous descriptions.

Figure 8B:
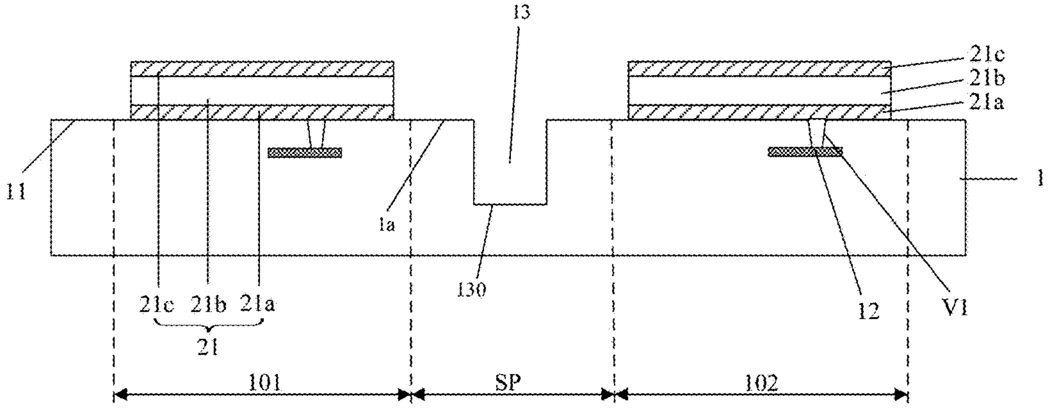

As shown in FIG. 8B, a second recess 13 is formed in the middle portion 1*a* of the main surface 11.

Figure 8C:
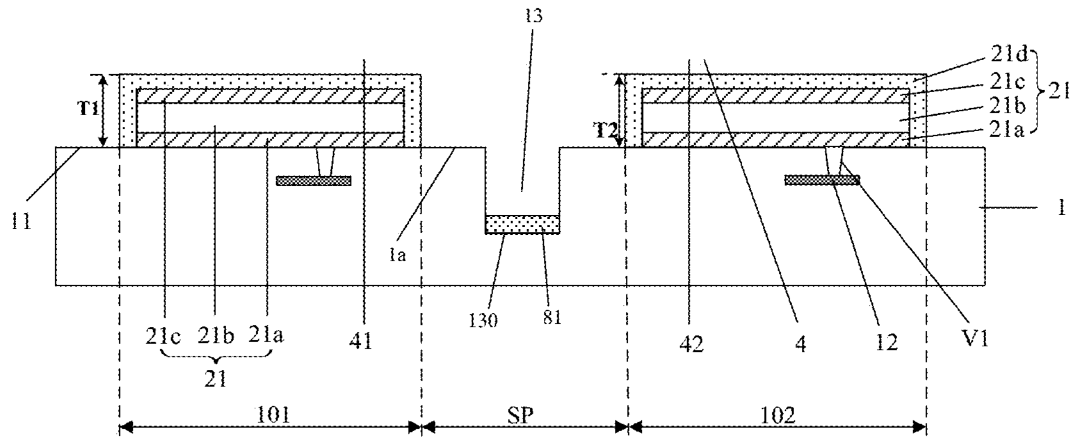

As shown in FIG. 8C, a first etching stop layer 81 is formed, the second recess 13 has a second bottom surface 130 substantially parallel to the main surface 11, the first etching stop layer 81 is located in the second recess 13 and on the second bottom surface 130. Forming the first etching stop layer 81 includes: forming a transparent electrode material layer (not shown) covering the metal electrode layer of the first electrode 21 of the first sub-pixel 101, the metal electrode layer of the first electrode 21 of the second sub-pixel 102, and the second bottom surface 130; performing a patterning process on the transparent electrode material layer to form a transparent electrode layer 21*d* covering the metal electrode layer of the first electrode 21 of the first sub-pixel 101, a transparent electrode layer 21*d* covering the metal electrode layer of the first electrode 21 of the second sub-pixel 102, and the first etching stop layer 81, so as to fully utilize the function and positional relationship between the transparent electrode layers 21*d* and the first etching stop layer 81, and perform the same one patterning process on the same one film layer to form the transparent electrode layers 21*d* and the first etching stop layer 81, which saves process steps, without an additional patterning process for disposing the first etching stop layer 81.

Figure 8D:
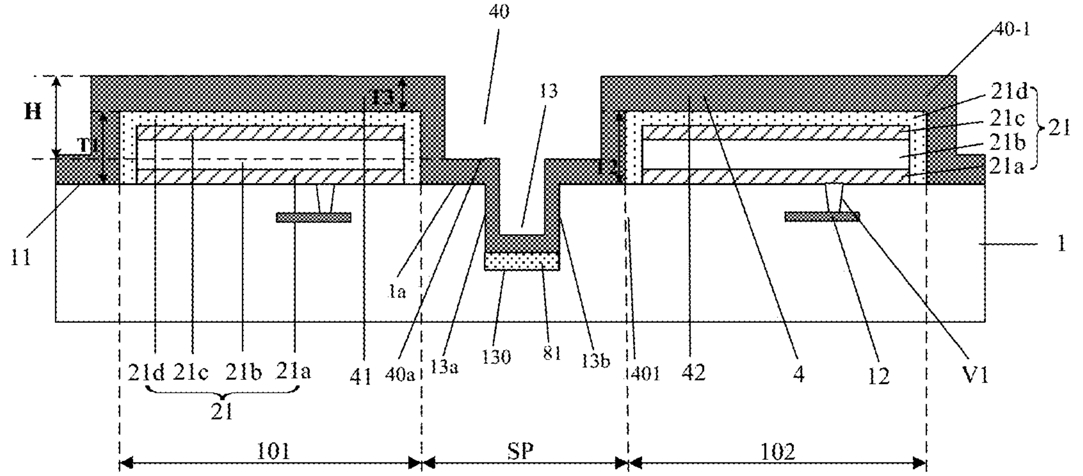

As shown in FIG. 8D, a pixel definition material layer 40-1 covering the first electrode 21 of the first sub-pixel 101, the first electrode 21 of the second sub-pixel 102 and the second recess 13 is formed.

Figure 8E:
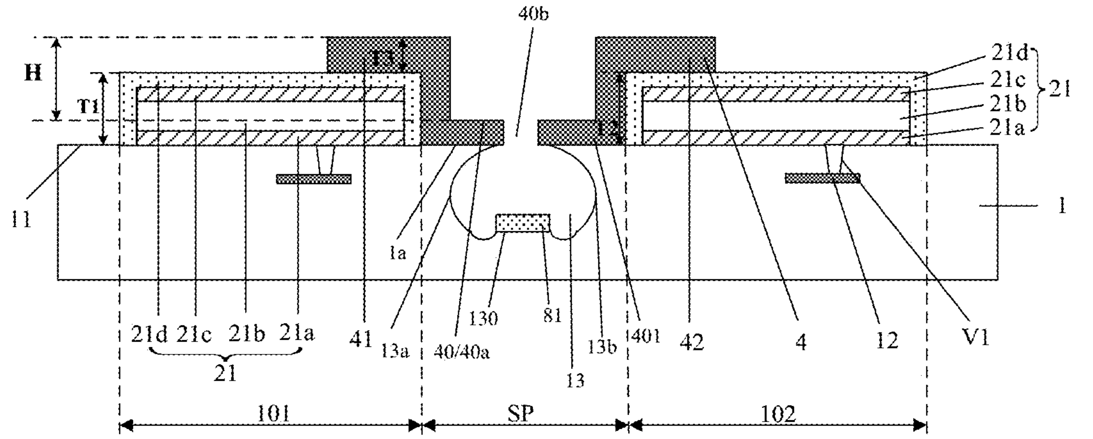

As shown in FIG. 8E, a patterning process is performed on the pixel definition material layer 40-1 to form a fracture 40*b* and opening regions, thereby forming the pixel definition layer 4, and the pixel definition layer 4 includes a spacing part 401, a first stack part 41, and a second stack part 42. The spacing part 401 is located in the space SP between the first electrode 21 of the first sub-pixel 101 and the first electrode 21 of the second sub-pixel 102; the first stack part 41 is stacked on the side of the first electrode 21 of the first sub-pixel 101 away from the substrate 1 in the direction perpendicular to the main surface 11; the second stack part 42 is stacked on the side of the first electrode 21 of the second sub-pixel 102 away from the substrate 1 in the direction perpendicular to the main surface 11, the spacing part 401 includes a first recess 40; the fracture 40*b* is located in the spacing part 401 of the pixel definition layer 4 at the second recess 13 and penetrates through the spacing part 401, the second recess 13 is in communication with the first recess 40 through the fracture 40*b*. For example, in the process of patterning the pixel definition layer 4 by an etching method such as wet etching, the first etch stop layer 81 can prevent the second bottom surface 130 of the second recess 13 from being etched, such that a plurality of second recesses 13 in the entire display panel have the same depth, such that the subsequently formed film layers, such as the hole injection layers, the charge generation layers of the respective sub-pixels have uniform and consistent structures, and Mura display failure is prevented and display quality is improved. In addition to etching the material layer for forming the pixel definition layer 4, the etchant continuously etches portions of the recess wall of the second recess 13 that is not covered by the first etching stop layer 81, including continuously etching the side surfaces 13*a*/13*b* of the second recess 13 intersecting the second bottom surface 130 thereof, such that the side surfaces 13*a*/13*b* of the second recess 13 are recessed toward the direction away from the first etching stop layer 81, which is more advantaged for the disconnection of the layers (e.g., the charge generation layers 3, the first light-emitting layers 61, the hole injection layers 5) of adjacent sub-pixels formed on the pixel definition layer 4 and in the first recess 40 in subsequent processes. That is, the second recess 13 is etched after the second etching stop layer 82 is formed, the second etching stop layer 82 has a fixed thickness and can prevent a portion of the substrate 1 masked by the second etching stop layer 82 from being etched during the subsequent etching processes, such as the etching process for forming the pixel definition layer 4, such that the first recesses 400 between adjacent sub-pixels 100 can be achieved to have the same depth through controlling the thicknesses of the second etching stop layers 82 between adjacent sub-pixels 100 in the direction perpendicular to the main surface 11 to be equal, thereby ensuring the subsequently formed multiple sub-pixels have uniform functional layer structures, preventing Mura defects, and improving display uniformity of the display panel.

For example, the thickness of the second etching stop layer 82 in the direction perpendicular to the main surface 11 is equal to the thicknesses T1/T2 of the first electrodes 21 in the direction perpendicular to the main surface 11; for example, the thicknesses of the first electrodes 21 of the plurality of sub-pixels in the direction perpendicular to the main surface 11 are equal, which is advantaged for improving the display uniformity of the display panel.

For example, the size of the second recess 13 in the direction parallel to the main surface 11 first gradually increases and then gradually decreases, or, the size of the second recess 13 in the direction parallel to the main surface 11 gradually increases along the direction from the main surface 11 to the bottom surface of the second recess 13, so that it is more advantaged for the layers (charge generation layers 3, first light-emitting layers 61, hole injection layers 5) of adjacent sub-pixels formed on the pixel definition layer 4 and in the first recess 40 in subsequent processes being disconnected from each other by the second recess 13.

Figure 8F:
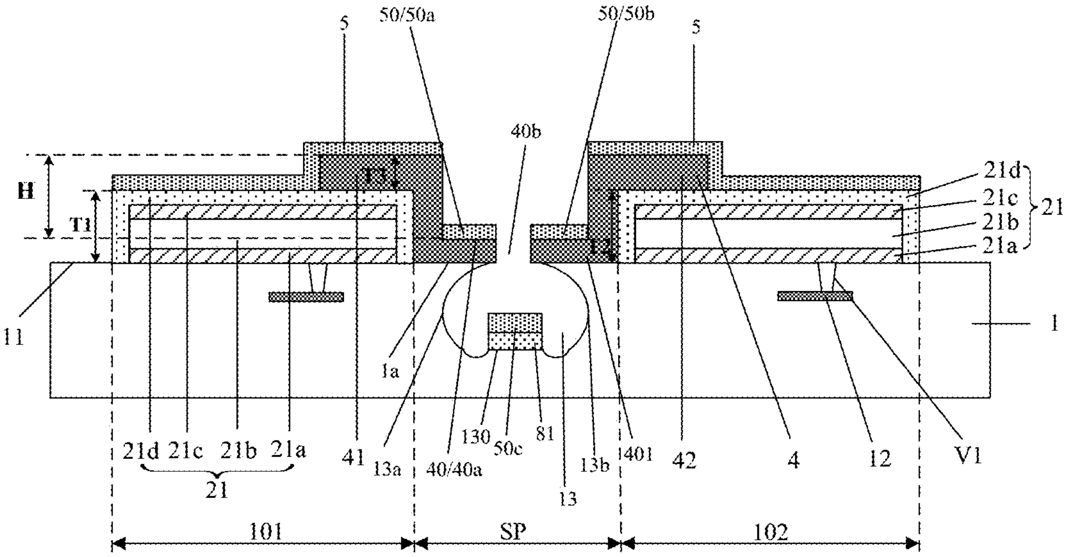

As shown in FIG. 8F, a hole injection layer 5 of the first sub-pixel 101, a hole injection layer 5 of the second sub-pixel 102 and a floating hole injection layer 50 are formed on the side of the pixel definition layer 4 away from the substrate 1 by using the same one material and the same one layer forming process (for example, including the same one sputtering process); the second recess 13 has a second bottom surface 130 substantially parallel to the main surface 11, and the floating hole injection layer 50 includes a first portion 50*a* and a second portion 50*b*, the first portion 50*a* and the second portion 50*b* are located in the first recess 40, and the first portion 50*a* is spaced apart from the second portion 50*b* due to the level difference formed by the communication between the fracture 40*b* and the second recess 13. The first portion 50*a* and the second portion 50*b* of the floating hole injection layer 50 are located on the bottom surface 40*a* and respectively located on opposite sides of the fracture 40*b*. For example, the floating hole injection layer 50 further includes a third portion 50*c*, the third portion 50*c* is located in the second recess 13 and on a side of the first etching stop layer 81 away from the substrate 1.

Figure 8G:
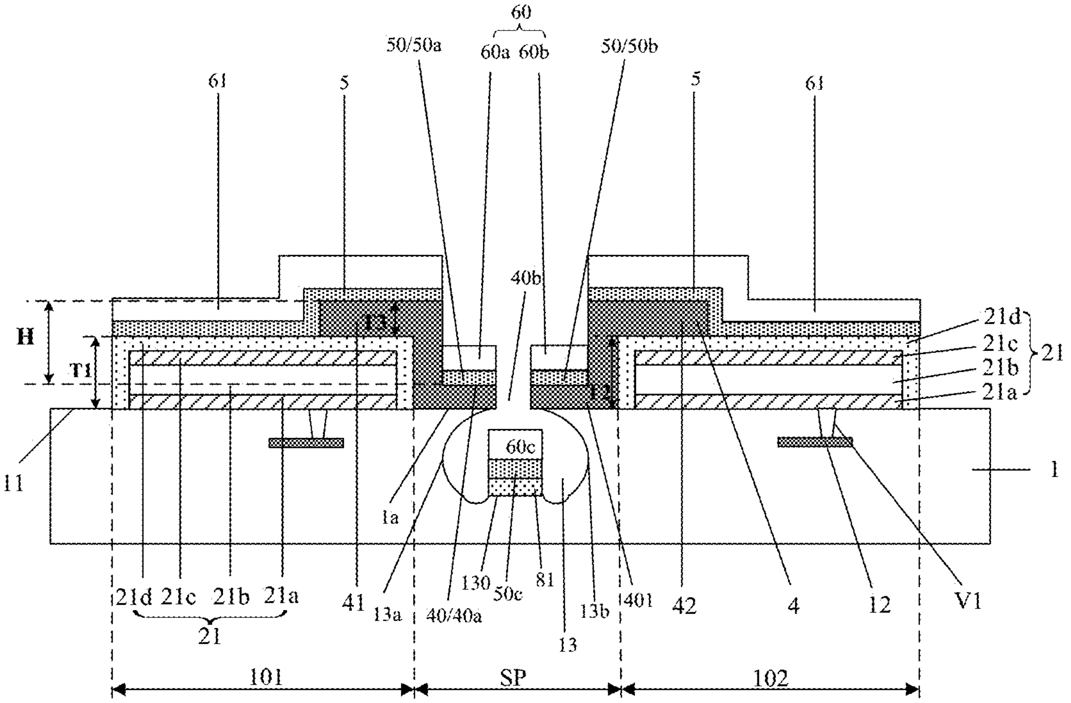

As shown in FIG. 8G, a first light-emitting element 61 of the first sub-pixel 101, a first light-emitting element 61 of the second sub-pixel 102 and a floating light-emitting layer 60 are formed on a side of the hole injection layer 5 away from the substrate 1 using the same one material and the same one layer forming process (e.g., including the same one sputtering process); the floating light-emitting layer 60 includes a first portion 60*a* and a second portion 60*b*, the first portion 60*a* and the second portion 60*b* are located in the second recess 13, and the first portion 60*a* is spaced apart from the second portion 60*b* due to the level difference formed by the communication between the fracture 40*b* and the second recess 13. The first portion 60*a* and the second portion 60*b* of the floating light-emitting layer 60 are located on the bottom surface 40*a* and respectively located on opposite sides of the fracture 40*b*. The first portion 60*a* of the floating light-emitting layer 60 is stacked with the first portion 50*a* of the floating hole injection layer 50, and is located on the side of the first portion 50*a* of the floating hole injection layer 50 away from the substrate 1; the second portion 60*b* of the floating light-emitting layer 60 is stacked with the second portion 50*b* of the floating hole injection layer 50 and is located on a side of the second portion 50*b* of the floating hole injection layer 50 away from the substrate 1. For example, the floating light-emitting layer 60 further includes a third portion 60*c*, the third portion 60*c* is located in the second recess 13 and on a side of the third portion 50*c* of the floating hole injection layer 50 away from the substrate 1.

Figure 8H:
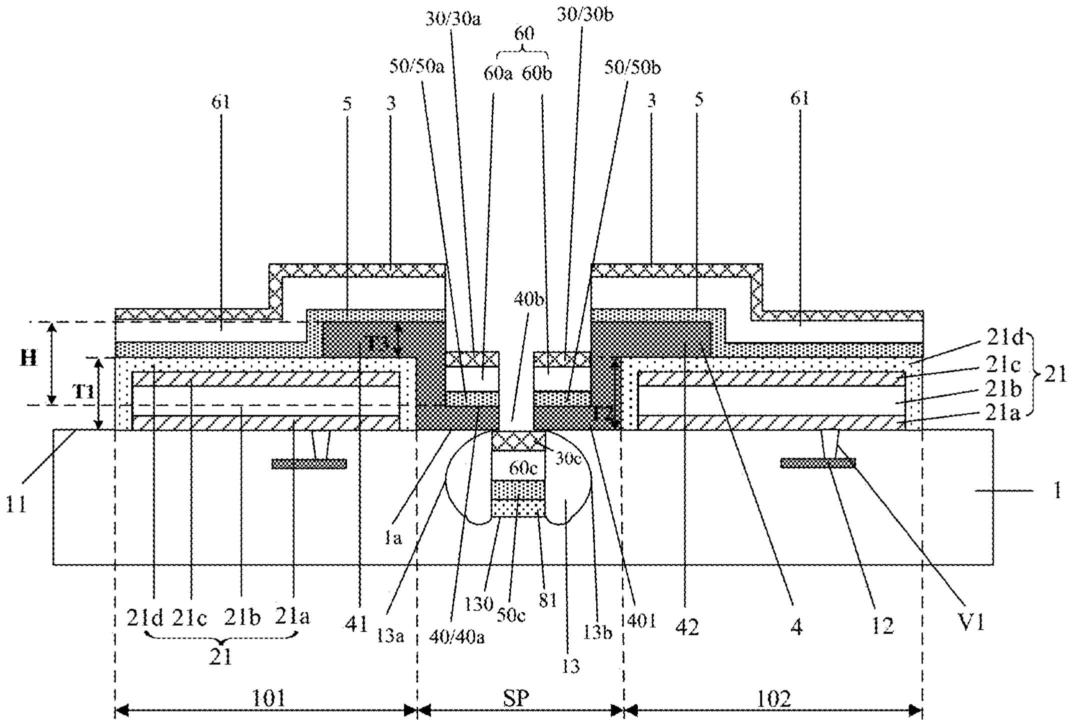

As shown in FIG. 8H, a charge generation layer 3 of the first sub-pixel 101, a charge generation layer 3 of the second sub-pixel 102 and a floating charge generation layer 30 are formed on a side of the pixel definition layer 4 away from the substrate 1 using the same one material and the same one layer forming process (e.g., including the same one sputtering process). The floating charge generation layer 30 is located in the second recess 13, and stacked with the first etching stop layer 81, the third portion 50*c* of the floating hole injection layer 50, and the third portion 60*c* of the floating light-emitting layer 60, and is located on a side of the third portion 60*c* of the light-emitting layer 60 away from the second bottom surface 130. The charge generation layer 3 of the first sub-pixel 101 is located on a side of the first stack part 41 away from the main surface 11, the charge generation layer 3 of the second sub-pixel 102 is located on a side of the second stack part 42 away from the main surface 11, the charge generation layer 3 of the first sub-pixel 101 is disconnected from the floating charge generation layer 30, and the charge generation layer 3 of the second sub-pixel 102 is disconnected from the floating charge generation layer 30. Due to the level difference formed by the communication between the fracture 40*b* and the second recess 13, the floating charge generation layer 30 includes the first portion 30*a* and the second portion 30*b* that are spaced apart from each other, thereby further effectively ensuring the effect that the charge generation layer 3 of the first sub-pixel 101 and the charge generation layer 3 of the second sub-pixel 102 are completely disconnected from each other.

Figure 8I:
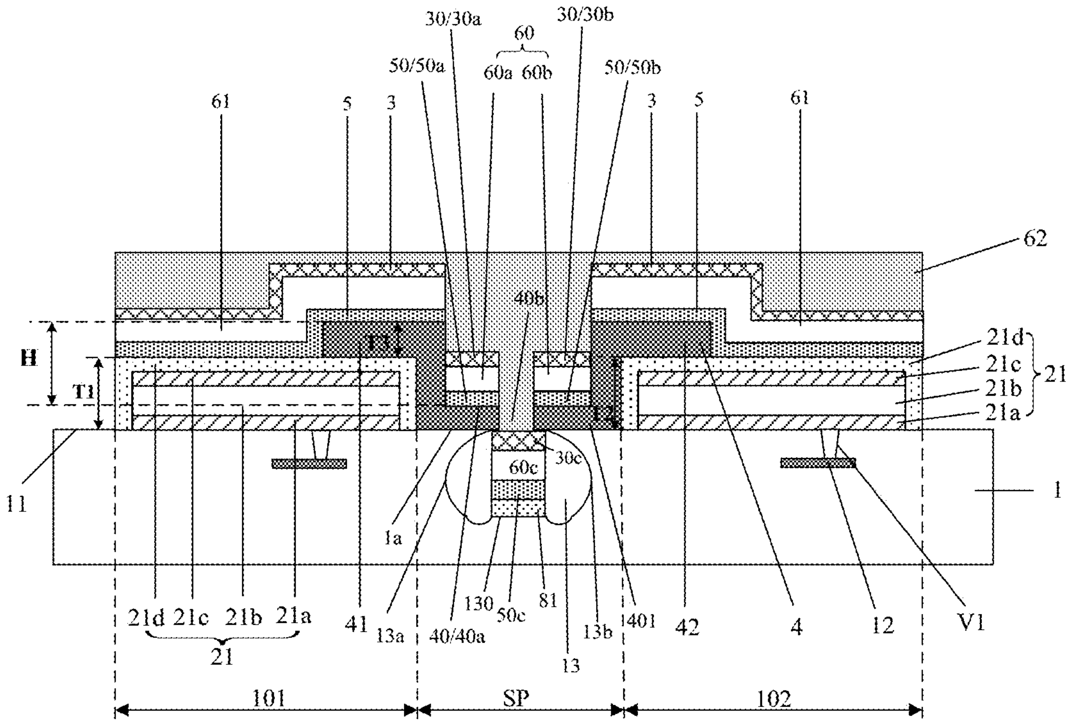
Figure 8J:
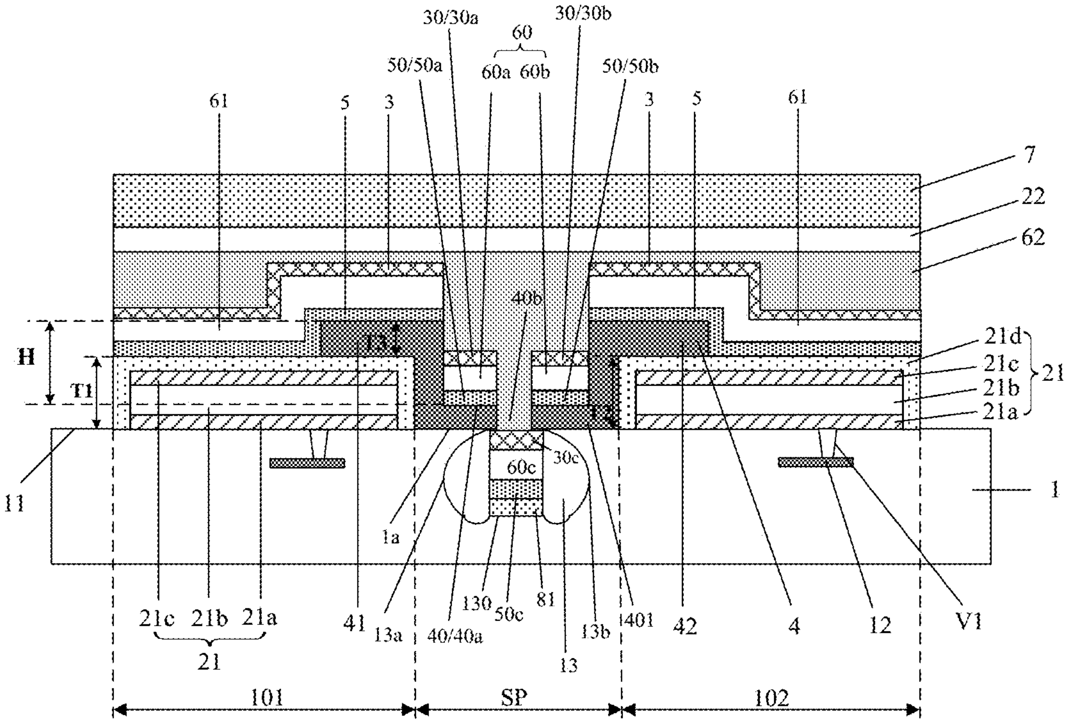

As shown in FIG. 8I to FIG. 8J, a second light-emitting element 62, a second electrode 22 and an encapsulation layer 7 are sequentially formed on the side of the charge generation layer 3 away from the substrate 1, thereby forming the display panel shown in FIG. 3.

FIG. 9A to FIG. 9G are schematic views illustrating a method of manufacturing the display panel shown in FIG. 5 provided by an embodiment of the present disclosure. The manufacturing method of the display panel will be introduced below with reference to FIG. 9A to FIG. 9J. Herein, two adjacent sub-pixels of the display panel, that is, the first sub-pixel 101 and the second sub-pixel 102 are taken as an example for introduction, which is the same for other sub-pixels.

Figure 9A:
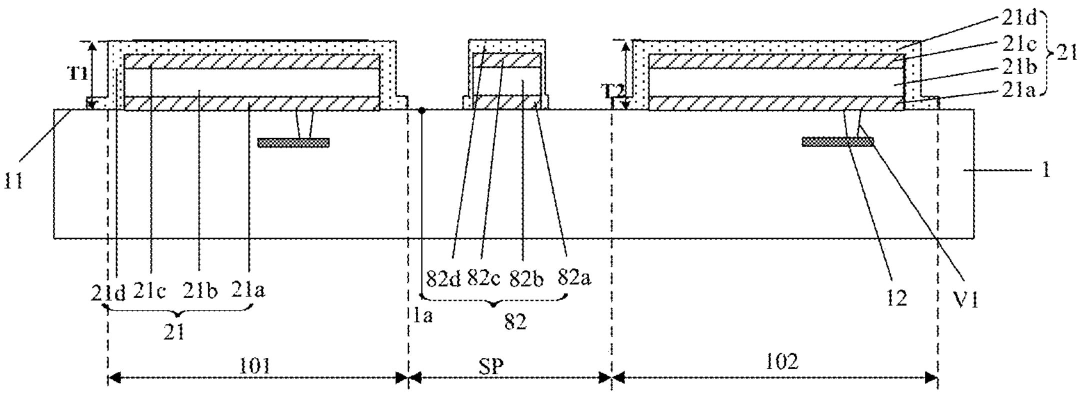
FIG. 9A to FIG. 9G are schematic views illustrating yet another manufacturing method of a display panel provided by an embodiment of the present disclosure.

As shown in FIG. 9A, a substrate 1 is provided, and the substrate 1 has a main surface 11. For example, the material of the substrate 1 is silicon oxide, silicon nitride, etc., for example, the substrate 1 is the uppermost silicon oxide layer of a silicon-based substrate. The manufacturing method of the display panel includes forming a plurality of sub-pixels on the substrate 1, and each sub-pixel in the plurality of sub-pixels includes a light-emitting device located on the main surface 11.

For example, as shown in FIG. 9A, the manufacturing method of the display panel includes: forming a second etching stop layer 82 on the main surface 11, and the second etching stop layer 82 is located in the space SP between the first electrode 21 of the first sub-pixel 101 and the first electrode 21 of the second sub-pixel 201. The manufacturing method of the display panel includes the following processes: a metal electrode material layer is formed on the main surface 11, and a patterning process is performed on the metal electrode material layer to form a metal electrode layer of the first electrode 21 of the first sub-pixel 101, a metal electrode layer of the first electrode 21 of the second sub-pixel 102, and a metal electrode layer of the second etching stop layer 82, the metal electrode layer of the second etching stop layer 82 is located between the metal electrode layer of the first electrode 21 of the first sub-pixel 101 and the metal electrode layer of the first electrode 21 of the second sub-pixel 102. After the metal electrode layers are formed, a transparent electrode material layer is formed to cover the metal electrode layer of the first electrode 21 of the first sub-pixel 101, the first electrode 21 of the second sub-pixel 102, and the metal electrode layer of the second etching stop layer 82, a patterning process is performed on the transparent electrode material layer to form a transparent electrode layer 21*d* covering the metal electrode layer of the first electrode 21 of the first sub-pixel 101, a transparent electrode layer 21*d* covering the metal electrode layer of the first electrode 21 of the second sub-pixel 102, and a transparent electrode layer 21*d* covering the metal electrode layer of the second etching stop layer 82. This design makes full use of the position and structure of the original first electrodes, and the second etching stop layer 82 is formed by performing the same one patterning process on the material layer for forming the first electrodes, therefore, it is unnecessary to add a separate patterning process for the second etching stop layer 82, which simplifies the manufacturing process of the display panel.

For example, the metal electrode layer is a Ti/Al/Ti stack structure. As shown in FIG. 9A, the metal electrode layer includes a first sublayer 21*a*, a second sublayer 21*b*, and a third sublayer 21*c* stacked on the main surface of the substrate 1, for example, the material of the first sublayer 21*a* is titanium metal (Ti), the material of the second sublayer 21*b* is metal aluminum (Al), and the material of the third sublayer 21*c* is metal titanium (Ti), thereby forming a Ti/Al/Ti/ITO stack structure constituted by the first sublayer 21*a*, the second sublayer 21*b* and the third sublayer 21*c*. For example, the material of the transparent electrode layer 21 is a transparent conductive material, such as ITO, IZO, or the like.

Figure 9B:
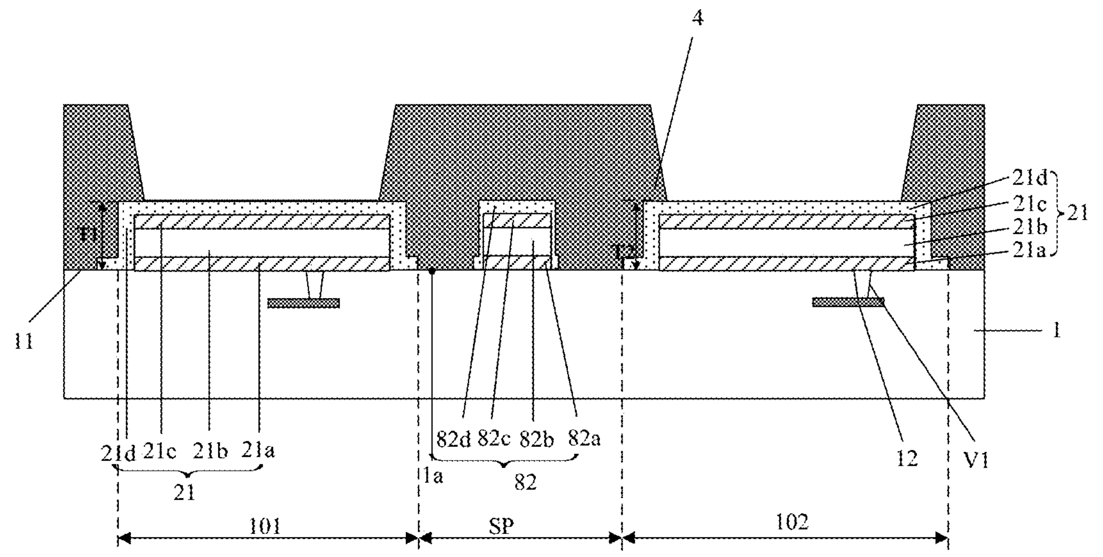

As shown in FIG. 9B, a pixel definition material layer is formed on a side of the first electrode 21 of the first sub-pixel 101 and the first electrode 21 of the second sub-pixel 102 away from the substrate 1, and the pixel definition material layer covers the first electrode 21 of the first sub-pixel 101, the first electrode 21 of the second sub-pixel 102, and the second etching stop layer 82, a first patterning process is performed on the pixel definition material layer to form a plurality of opening regions exposing the first electrodes 21 of the respective sub-pixels.

Figure 9C:
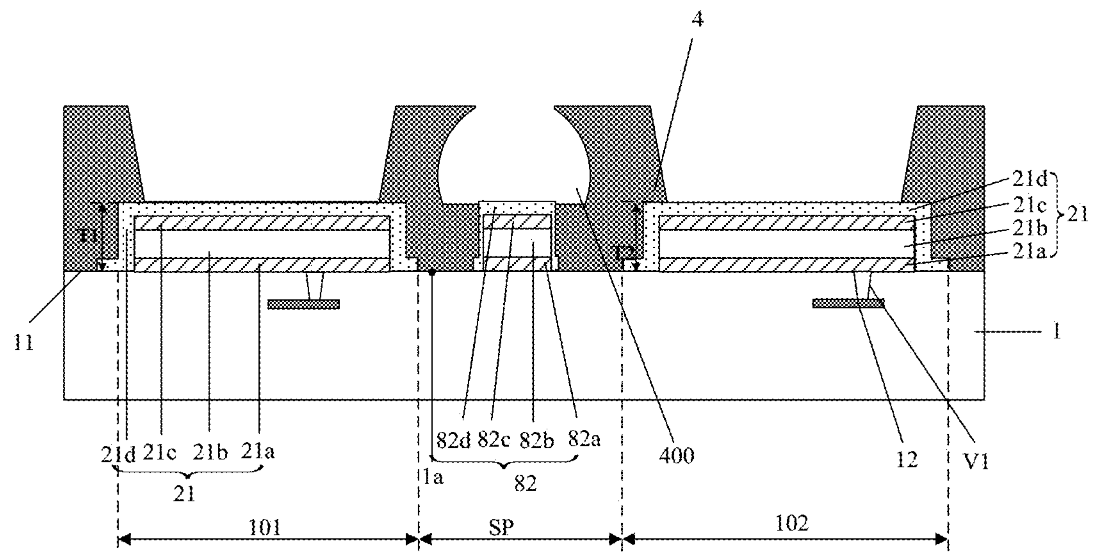

As shown in FIG. 9C, a second patterning process is performed on the pixel definition material layer to form the first recess 40, the first recess 40 is located on the side of the second etching stop layer 82 away from the substrate 1, and exposes at least a portion of the upper surface of the second etching stop layer 82 away from the substrate 1.

Figure 9D:
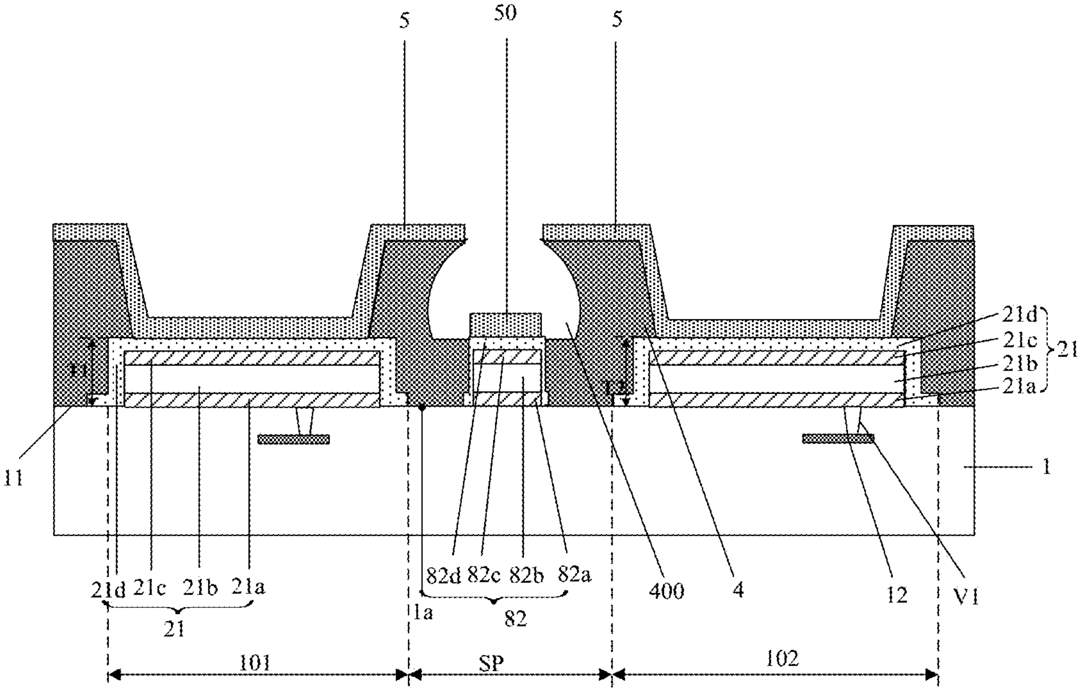

As shown in FIG. 9D, a hole injection layer 5 of the first sub-pixel 101, a hole injection layer 5 of the second sub-pixel 102 and a floating hole injection layer 50 are formed on a side of the pixel definition layer 4 away from the substrate 1 using the same one material and the same one layer forming process (e.g., including the same one sputtering process); during the process of forming the hole injection layers 5 through deposition or sputtering, the hole injection layer 5 of the first sub-pixel 101 and the hole injection layer 5 of the second sub-pixel 102 can be disconnected from each other by utilizing the level difference formed by the first recess 400 in the direction perpendicular to the main surface 11 of the substrate 1. In each sub-pixel, the hole injection layer 5 is stacked and in contact with the first electrode 21; the floating hole injection layer 50 is located in the first recess 400, stacked with the second etching stop layer 82, and located on a side of the second etching stop layer 82 away from the substrate 1. For example, the distance from the floating hole injection layer 50 to the main surface 11 is less than the distance from the first portion 41 of the pixel definition layer 4 to the main surface 11, and less than the distance from the second portion 42 of the pixel definition layer 4 to the main surface 11, that is, level differences are existed between the floating hole injection layer 50 and both the upper surfaces of the first portion 41 and the second portion 42 of the pixel definition layer 4 away from the substrate 1 in the direction perpendicular to the main surface 11.

Figure 9E:
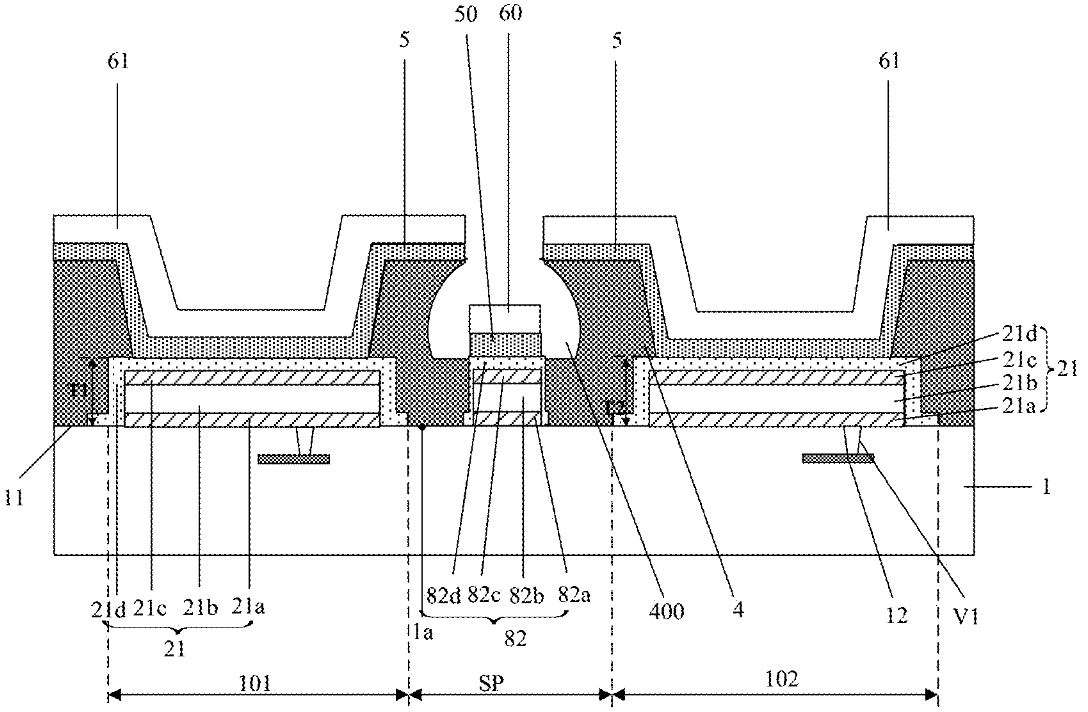

As shown in FIG. 9E, a first light-emitting element 61 of the first sub-pixel 101, a first light-emitting element 61 of the second sub-pixel 102 and a floating light-emitting layer 60 are formed on a side of the hole injection layers 5 away from the substrate 1 using the same one material and the same one layer forming process (e.g., including the same one sputtering process); during the process of forming the first light-emitting elements 61, the first light-emitting element 61 of the first sub-pixel and the first light-emitting element 61 of the second sub-pixel 102 are disconnected from each other by utilizing the level difference formed by the first recess 400 in the direction perpendicular to the main surface 11 of the substrate 1, and the level differences between the floating hole injection layer 50 and both the upper surfaces of the first portion 41 and the second portion 42 of the pixel definition layer 4 away from the substrate 1 in the direction perpendicular to the main surface 11. In each sub-pixel, the first light-emitting element 61 is stacked and in contact with the hole injection layer 5; the floating light-emitting layer 60 is located in the first recess 400, stacked with the floating hole injection layer 50, and located on a side of the floating hole injection layer 50 away from the substrate 1. For example, the distance from the floating first light-emitting layer 60 to the main surface 11 is less than the distance from the upper surface of the first portion 41 of the pixel definition layer 4 away from the substrate 1 to the main surface 11, and less than the distance from the upper surface of the second portion 42 of the pixel definition layer 4 away from the substrate 1 to the main surface 11, that is, level differences are existed between the floating first light-emitting layer 60 and both the upper surfaces of the first portion 41 and the second portion 42 of the pixel definition layer 4 away from the substrate 1 in the direction perpendicular to the main surface 11.

Figure 9F:
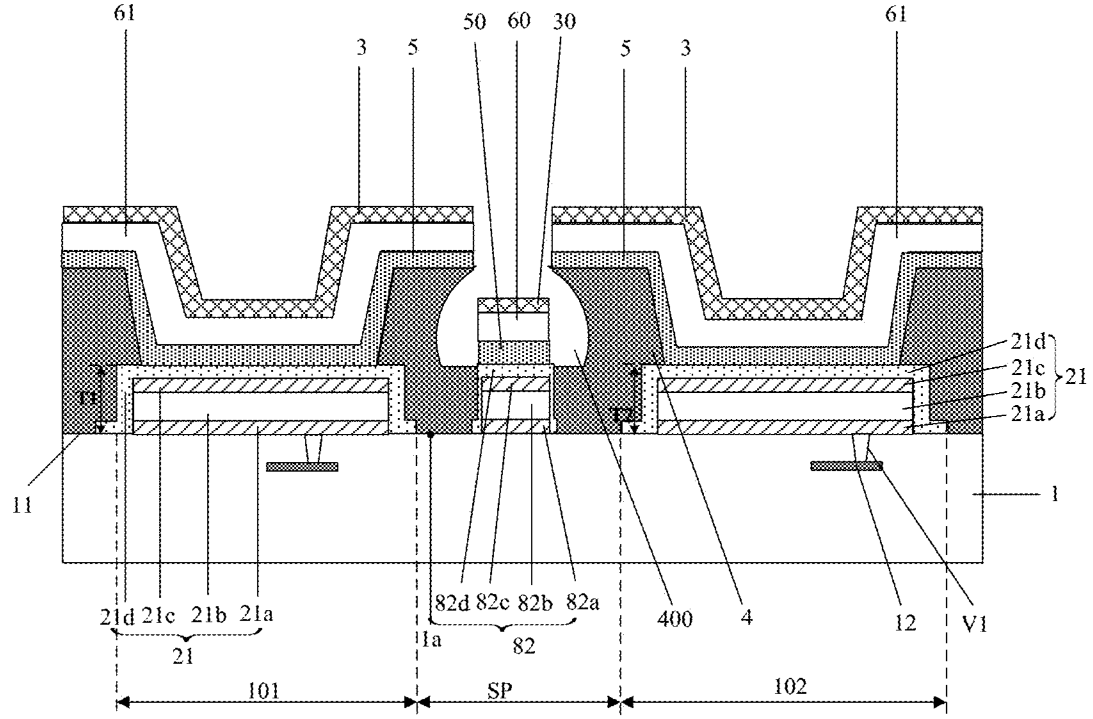

As shown in FIG. 9F, a charge generation layer 3 of the first sub-pixel 101, a charge generation layer 3 of the second sub-pixel 102 and a floating charge generation layer 30 are formed on a side of the first light-emitting elements 61 away from the substrate 1 using the same one material and the same one layer forming process (e.g., including the same one sputtering process); during the process of forming the charge generation layers 3, the charge generation layer 3 of the first sub-pixel 101 and the charge generation layer 3 of the second sub-pixel 102 are disconnected from each other by utilizing the level difference formed by the first recess 400 in the direction perpendicular to the main surface 11 of the substrate 1, and the level differences between the floating first light-emitting layer 60 and both the upper surfaces of the first portion 41 and the second portion 42 of the pixel definition layer 4 away from the substrate 1 in the direction perpendicular to the main surface 11. In each sub-pixel, the charge generation layer 3 is stacked with the first light-emitting element 61 and the hole injection layer 5; the floating charge generation layer 30 is located in the first recess 400, and stacked with the floating first light-emitting layer 60 and the floating hole injection layer 50, and located on a side of the floating first light-emitting layer 60 away from the substrate 1. For example, the distance from the floating charge generation layer 30 to the main surface 11 is less than the distance from the first portion 41 of the pixel definition layer 4 to the main surface 11, and less than the distance from the second portion 42 of the pixel definition layer 4 to the main surface 11, so as to ensure the effect that the charge generation layer 3 of first sub-pixel 101 and the charge generation layer 3 of the second sub-pixel 102 are disconnected from each other. Of course, in other embodiments, the distance from the floating charge generation layer 30 to the main surface 11 may be greater than or equal to the distance from the first portion 41 of the pixel definition layer 4 to the main surface 11, and less than the distance from the second portion 42 of the pixel definition layer 4 to the main surface 11, as long as the charge generation layer 3 of the first sub-pixel 101 and the charge generation layer 3 of the second sub-pixel 102 are disconnected from each other.

Figure 9G:
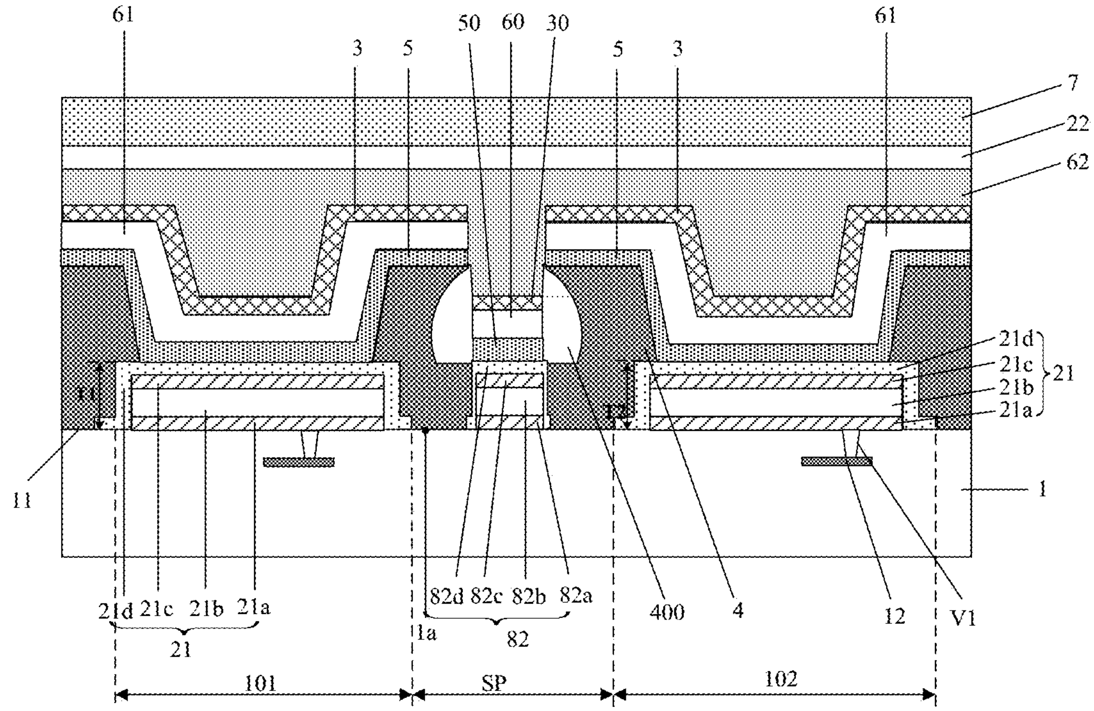

As shown in FIG. 9G, a second light-emitting element 62, a second electrode 22 and an encapsulation layer 7 are sequentially formed on the side of the charge generation layers 3 away from the substrate 1, thereby the display panel illustrated in FIG. 5 is formed.

What have been described above are only specific implementations of the present disclosure, the protection scope of the present disclosure is not limited thereto, and the protection scope of the present disclosure should be based on the protection scope of the claims.

The invention claimed is:

1. A display panel, comprising:

a substrate, having a main surface;

a plurality of sub-pixels, wherein each sub-pixel of the plurality of sub-pixels comprises a light-emitting device on the main surface, the light-emitting device comprises a first electrode and a charge generation layer that are stacked in a direction perpendicular to the main surface, the charge generation layer is on a side of the first electrode away from the substrate; and a pixel definition layer, on the main surface and defining a plurality of opening regions, wherein the plurality of opening regions are in one-to-one correspondence with the plurality of sub-pixels and expose at least part of the first electrodes of corresponding sub-pixels of the plurality of sub-pixels;

wherein the plurality of sub-pixels comprise a first sub-pixel and a second sub-pixel that are adjacent to each other, and a space is between the first electrode of the first sub-pixel and the first electrode of the second sub-pixel, the pixel definition layer comprises a first recess which is in the space and recessed toward the main surface, the charge generation layer of the first sub-pixel is spaced apart from the charge generation layer of the second sub-pixel by the first recess;

the pixel definition layer comprises a plurality of first recesses located in spaces between different adjacent two sub-pixels among the plurality of sub-pixels, and depths of the plurality of first recesses in the direction perpendicular to the main surface are equal, the display panel further comprises:

a floating charge generation layer in the first recess, wherein a material of the floating charge generation layer is same as materials of the charge generation layer of the first sub-pixel and the charge generation layer of the second sub-pixel, wherein the charge generation layer of the first sub-pixel and the charge generation layer of the second sub-pixel are on a side of the pixel definition layer away from the main surface;

the charge generation layer of the first sub-pixel is disconnected from the floating charge generation layer, and the charge generation layer of the second sub-pixel is disconnected from the floating charge generation layer, and the charge generation layer of the first sub-pixel and the charge generation layer of the second sub-pixel both are outside the first recess.

2. The display panel according to claim 1, wherein the pixel definition layer comprises:

a spacing part, in the space between the first electrode of the first sub-pixel and the first electrode of the second sub-pixel;

a first stack part, stacked on a side of the first electrode of the first sub-pixel away from the substrate in the direction perpendicular to the main surface; and a second stack part, stacked on a side of the first electrode of the second sub-pixel away from the substrate in the direction perpendicular to the main surface, wherein the spacing part comprises the first recess.

3. The display panel according to claim 2, wherein the main surface has a middle portion located at the space, the middle portion of the main surface is flat, and the spacing part is on the middle portion of the main surface; the first recess has a first bottom surface substantially parallel to the main surface;

the floating charge generation layer is on the first bottom surface, wherein the charge generation layer of the first sub-pixel is on a side of the first stack part away from the main surface, and the charge generation layer of the second sub-pixel is on a side of the second stack part away from the main surface.

4. The display panel according to claim 3, wherein the first stack part, the spacing part and the second stack part constitute a continuous integrated structure;

the spacing part of the pixel definition layer covers and directly contacts a side surface of the first electrode of the first sub-pixel close to the first electrode of the second sub-pixel, the flat middle portion of the main surface, and a side surface of the first electrode of the second sub-pixel close to the first electrode of the first sub-pixel;

the first stack part covers and directly contacts a portion of an upper surface of the first electrode of the first sub-pixel away from the substrate, and the second stack part covers and directly contacts a portion of an upper surface of the first electrode of the second sub-pixel away from the substrate.

5. The display panel according to claim 3, wherein an edge close to the second sub-pixel of an orthographic projection of the charge generation layer of the first sub-pixel on the main surface and an edge close to the first sub-pixel of an orthographic projection of the floating charge generation layer on the main surface are connected to each other, and an edge close to the first sub-pixel of an orthographic projection of the charge generation layer of the second sub-pixel on the main surface and an edge close to the second sub-pixel of an orthographic projection of the floating charge generation layer on the main surface are connected to each other.

6. The display panel according to claim 3, wherein thicknesses of the first electrodes of the plurality of sub-pixels in the direction perpendicular to the main surface are equal, and a thickness of the first electrode of each of the plurality of sub-pixels is not less than 450 μm, a depth of the first recess in a direction perpendicular to the main surface is not less than 900 μm.

7. The display panel according to claim 3, wherein both a ratio of a thickness of the first electrode of the first sub-pixel in the direction perpendicular to the main surface to a thickness of the pixel definition layer in the direction perpendicular to the main surface, and a ratio of a thickness of the first electrode of the second sub-pixel in the direction perpendicular to the main surface to the thickness of the pixel definition layer in the direction perpendicular to the main surface are not less than 2.

8. The display panel according to claim 2, wherein the main surface has a middle portion located at the space, the middle portion of the main surface has a second recess, and the spacing part of the pixel definition layer has a fracture which is at the second recess and penetrates through the spacing part, the second recess is in communication with the first recess through the fracture;

the second recess has a second bottom surface substantially parallel to the main surface, and the display panel further comprises a first etching stop layer, the first etching stop layer is in the second recess and on the second bottom surface, and a material of the first etching stop layer is different from a material of the substrate and different from a material of the pixel definition layer;

wherein the floating charge generation layer is in the second recess and on a side of the first etching stop layer away from the second bottom surface, wherein a material of the floating charge generation layer is same as both a material of the charge generation layer of the first sub-pixel and a material of the charge generation layer of the second sub-pixel, wherein the charge generation layer of the first sub-pixel is located on a side of the first stack part away from the main surface, and the charge generation layer of the second sub-pixel is located on a side of the second stack part away from the main surface.

9. The display panel according to claim 8, wherein the first electrode of each of the plurality of sub-pixels comprises a metal electrode layer and a transparent electrode layer that are stacked in the direction perpendicular to the main surface, the transparent electrode layer covers the metal electrode layer, and the first etching stop layer and the transparent electrode layer are made of a same material and are at a same layer.

10. The display panel according to claim 8, wherein along a direction from the main surface to a bottom surface of the second recess, a size of the second recess in a direction parallel to the main surface gradually increases, or first gradually increases and then gradually decreases.

11. The display panel according to claim 10, wherein a shape of a cross-section of the second recess along the direction perpendicular to the main surface is a trapezoid or an irregular shape, and the irregular shape comprises a bottom edge substantially parallel to the main surface, a first side edge and a second side edge that face each other and both intersect the bottom edge, the first side edge is recessed toward a direction away from the second side edge, and the second side edge is recessed toward a direction away from the first side edge.

12. The display panel according to claim 2, wherein the display panel further comprises:

a second etching stop layer, on the main surface and in the space, wherein the second etching stop layer, the first electrode of the first sub-pixel, and the first electrode of the second sub-pixel are made of a same material, at a same layer and spaced apart from each other;

the first recess is on a side of the second etching stop layer away from the substrate, and exposes at least a portion of an upper surface of the second etching stop layer that is away from the substrate.

13. The display panel according to claim 12, wherein along a direction from a location away from the main surface to a location close to the main surface, a size of the first recess in a direction parallel to the main surface gradually increases, or, first gradually increases and then gradually decreases.

14. The display panel according to claim 1, wherein the light-emitting device comprises a first light-emitting element emitting light of a first color and a second light-emitting element emitting light of a second color, the first color is different from the second color, and the charge generation layer is between the first light-emitting element and the second light-emitting element and is connected to the first light-emitting element and the second light-emitting element.

15. A display apparatus, comprising the display panel according to claim 1.

16. A method of manufacturing a display panel, comprising:

providing a substrate, wherein the substrate has a main surface;

forming a plurality of sub-pixels on the substrate, wherein each sub-pixel of the plurality of sub-pixels comprises a light-emitting device on the main surface, and the light-emitting device comprises a first electrode and a charge generation layer that are stacked in a direction perpendicular to the main surface, the charge generation layer is on a side of the first electrode away from the substrate; and forming a pixel definition layer, wherein the pixel definition layer is on the main surface and defines a plurality of opening regions, wherein the plurality of opening regions are in one-to-one correspondence with the plurality of sub-pixels, and expose at least part of first electrodes of corresponding sub-pixels of the plurality of sub-pixels;

wherein the plurality of sub-pixels comprises a first sub-pixel and a second sub-pixel adjacent to each other, and a space is between the first electrode of the first sub-pixel and the first electrode of the second sub-pixel, the pixel definition layer comprises a first recess which is in the space and recessed toward the main surface, the charge generation layer of the first sub-pixel is spaced apart from the charge generation layer of the second sub-pixel by the first recess;

the pixel definition layer comprises a plurality of first recesses located in spaces between different adjacent two sub-pixels among the plurality of sub-pixels, and depths of the plurality of first recesses in the direction perpendicular to the main surface are equal, the display panel further comprises:

a floating charge generation layer in the first recess, wherein a material of the floating charge generation layer is same as materials of the charge generation layer of the first sub-pixel and the charge generation layer of the second sub-pixel, wherein the charge generation layer of the first sub-pixel and the charge generation layer of the second sub-pixel are on a side of the pixel definition layer away from the main surface;

the charge generation layer of the first sub-pixel is disconnected from the floating charge generation layer, and the charge generation layer of the second sub-pixel is disconnected from the floating charge generation layer, and the charge generation layer of the first sub-pixel and the charge generation layer of the second sub-pixel both are outside the first recess.

17. The method of manufacturing a display panel according to claim 16, wherein the main surface has a middle portion located at the space, the middle portion of the main surface is flat;

forming the first recess comprises:

forming the first electrode of the first sub-pixel and the first electrode of the second sub-pixel on the main surface, wherein the first electrode of the first sub-pixel and the first electrode of the second sub-pixel expose a portion of the main surface in the space;

forming a pixel-defining material layer on a side of the first electrode of the first sub-pixel and the first electrode of the second sub-pixel away from the substrate, so as to simultaneously form the first recess and the pixel definition layer by utilizing a thickness of the first electrode of the first sub-pixel in the direction perpendicular to the main surface and a thickness of the first electrode of the second sub-pixel in the direction perpendicular to the main surface, wherein the first recess is formed without performing a patterning process on the pixel definition layer;

performing a patterning process on the pixel definition material layer to form the plurality of opening regions, thereby forming the pixel definition layer; and forming the charged generated layer of the first sub-pixel, the charge generation layer of the second sub-pixel, and the floating charge generation layer on the side of the pixel definition layer away from the substrate by using a same one material and a same one layer forming process, wherein the first recess has a first bottom surface substantially parallel to the main surface, the floating charge generation layer is located in the first recess and on the first bottom surface, the charge generation layer of the first sub-pixel is located on a side of the first stack part away from the main surface, and the charge generation layer of the second sub-pixel is located on a side of the second stack part away from the main surface; and, the charge generation layer of the first sub-pixel is disconnected from the floating charge generation layer, and the charge generation layer of the second sub-pixel is disconnected from the floating charge generation layer by utilizing a depth of the first recess in the direction perpendicular to the substrate;

the pixel definition layer comprises:

a spacing part, in the space between the first electrode of the first sub-pixel and the first electrode of the second sub-pixel;

a first stack part, stacked on a side of the first electrode of the first sub-pixel away from the substrate in the direction perpendicular to the main surface; and a second stack part, stacked on a side of the first electrode of the second sub-pixel away from the substrate in the direction perpendicular to the main surface, wherein the spacing part comprises the first recess;

the spacing part of the pixel definition layer covers and directly contacts a side surface of the first electrode of the first sub-pixel close to the first electrode of the second sub-pixel, a portion of the main surface located at the space, and a side surface of the first electrode of the second sub-pixel close to the first electrode of the first sub-pixel;

the first stack part covers and directly contacts a portion of an upper surface of the first electrode of the first sub-pixel away from the substrate, and the second stack part covers and directly contacts a portion of an upper surface of the first electrode of the second sub-pixel away from the substrate.

18. The method of manufacturing the display panel according to claim 16, wherein the main surface has a middle portion located at the space, and the method comprises:

forming a second recess on the middle portion of the main surface;

forming a first etching stop layer, wherein the second recess has a second bottom surface substantially parallel to the main surface, and the first etching stop layer is located in the second recess and on the second bottom surface; and forming a pixel definition material layer covering the first electrode of the first sub-pixel, the first electrode of the second sub-pixel, and the second recess;

performing a patterning process on the pixel definition material layer to form a fracture and the opening regions to form the pixel definition layer, wherein the pixel definition layer comprises:

a spacing part, located in the space between the first electrode of the first sub-pixel and the first electrode of the second sub-pixel;

a first stack part, stacked on a side of the first electrode of the first sub-pixel away from the substrate in the direction perpendicular to the main surface; and a second stack part, stacked on a side of the first electrode of the second sub-pixel away from the substrate in a direction perpendicular to the main surface, wherein the spacing part comprises the first recess;

the fracture is located at the spacing part of the pixel definition layer at the second recess, and penetrates through the spacing part, and the second recess is in communication with the first recess through the fracture;

the method of manufacturing the display panel further comprises:

forming a metal electrode material layer on the main surface, and performing a patterning process on the metal electrode material layer to form a metal electrode layer of the first electrode of the first sub-pixel and a metal electrode layer of the first electrode of the second sub-pixel; and forming a transparent electrode material layer covering the metal electrode layer of the first electrode of the first sub-pixel, the metal electrode layer of the first electrode of the second sub-pixel, and the second bottom surface, and performing a patterning process on the transparent electrode material layer to form a transparent electrode layer of the first electrode of the first sub-pixel that covers the metal electrode layer of the first electrode of the first sub-pixel, a transparent electrode layer of the first electrode of the second sub-pixel that covers the metal electrode layer of the first electrode of the second sub-pixel, and the first etching stop layer.

19. The method of manufacturing the display panel according to claim 18, further comprising:

forming the charge generation layer of the first sub-pixel, the charge generation layer of the second sub-pixel, and the floating charge generation layer on the side of the pixel definition layer away from the substrate using a same one material and a same one layer forming process, wherein the second recess has a second bottom surface substantially parallel to the main surface, the floating charge generation layer is located in the second recess and located on a side of the first etching stop layer away from the second bottom surface, the charge generation layer of the first sub-pixel is located on a side of the first stack part away from the main surface, and the charge generation layer of the second sub-pixel is located on a side of the second stack part away from the main surface, the method of manufacturing the display panel further comprises:

etching the second recess after forming the second etching stop layer, such that along a direction from the main surface to a bottom surface of the second recess, a size of the second recess in a direction parallel to the main surface gradually increases, or first gradually increases and then gradually decreases.

20. The method of manufacturing the display panel according to claim 16, comprising:

forming a second etching stop layer on the main surface, wherein the second etching stop layer is located in the space between the first electrode of the first sub-pixel and the first electrode of the second sub-pixel;

forming a pixel definition material layer covering the first electrode of the first sub-pixel, the first electrode of the second sub-pixel, and the second etching stop layer; and performing a patterning process on the pixel definition material layer to form the first recess and the plurality of opening regions, wherein the first recess is located on a side of the second etching stop layer away from the substrate, and exposes at least a portion of an upper surface of the second etching stop layer away from the substrate;

the method of manufacturing the display panel comprises: forming a metal electrode material layer on the main surface, performing one patterning process on the metal electrode material layer to form a metal electrode layer of the first electrode of the first sub-pixel, a metal electrode layer of the first electrode of the second sub-pixel, and a metal electrode layer of the second etching stop layer, wherein the metal electrode layer of the second etching stop layer is located between the metal electrode layer of the first electrode of the first sub-pixel and the metal electrode layer of the first electrode of the second sub-pixel; and forming a transparent electrode material layer covering the metal electrode layer of the first electrode of the first sub-pixel, the first electrode of the second sub-pixel, and the metal electrode layer of the second etching stop layer, and performing one patterning process on the transparent electrode material layer to form a transparent electrode layer of the first electrode of the first sub-pixel that covers the metal electrode layer of the first electrode of the first sub-pixel, a transparent electrode layer of the first electrode of the second sub-pixel that covers the metal electrode layer of the first electrode of the second sub-pixel, and a transparent electrode layer of the second etching stop layer that covers the metal electrode layer of the second etching stop layer.

* * * * *